US012677445B2

(12) United States Patent
Watakabe et al.

(10) Patent No.: US 12,677,445 B2
(45) Date of Patent: Jul. 7, 2026

(54) SEMICONDUCTOR DEVICE

(71) Applicant: Japan Display Inc., Tokyo (JP)

(72) Inventors: Hajime Watakabe, Tokyo (JP);
Masashi Tsubuku, Tokyo (JP);
Toshinari Sasaki, Tokyo (JP); **Takaya
Tamaru**, Tokyo (JP)

(73) Assignee: Japan Display Inc., Tokyo (JP)

( * ) Notice: Subject to any disclaimer, the term of this
patent is extended or adjusted under 35
U.S.C. 154(b) by 375 days.

(21) Appl. No.: 18/456,832

(22) Filed: Aug. 28, 2023

(65) Prior Publication Data

US 2024/0097043 A1 Mar. 21, 2024

(30) Foreign Application Priority Data

Sep. 9, 2022 (JP) ................................. 2022-143864

(51) Int. Cl.
*H10D 30/67* (2025.01)
*H10D 99/00* (2025.01)
(52) U.S. Cl.
CPC ..... *H10D 30/6755* (2025.01); *H10D 30/6757*
(2025.01)
(58) Field of Classification Search
CPC ........... H10D 30/6755; H10D 30/6757; H10D
30/6723; H10D 30/6706; H10D 30/6704;
(Continued)

(56) References Cited

U.S. PATENT DOCUMENTS

2012/0064664 A1 3/2012 Yamazaki et al.
2014/0034946 A1 2/2014 Yamazaki et al.
(Continued)

FOREIGN PATENT DOCUMENTS

JP 2014099601 A 5/2014
JP 2016184771 A 10/2016
(Continued)

OTHER PUBLICATIONS

Office Action issued on Mar. 13, 2025, in corresponding German
Application No. 10 2023 208 538.0, 9 pages.
(Continued)

*Primary Examiner* — Omar F Mojaddedi
(74) *Attorney, Agent, or Firm* — Maier & Maier, PLLC

(57) ABSTRACT
A semiconductor device according to an embodiment of the
present invention includes an oxide insulating layer, an
oxide semiconductor layer, a gate insulating layer, a gate
electrode, and a protective insulating layer. The gate insu-
lating layer includes a first region overlapping the gate
electrode and a second region not overlapping the gate
electrode. The second region is in contact with the protective
insulating layer. The oxide insulating layer includes a third
region overlapping the gate electrode and a fourth region not
overlapping the gate electrode and the oxide semiconductor
layer. The fourth region is in contact with the gate insulating
layer. The oxide semiconductor layer includes a channel
region, a source region, and a drain region. Each of the
source region, the drain region, and the second region
contains an impurity. A hydrogen concentration of the sec-
ond region is greater than a hydrogen concentration of the
first region.

9 Claims, 30 Drawing Sheets

10

(58) Field of Classification Search
CPC .... H10D 62/115; H10D 99/00; H10D 64/516;
H10D 64/68
See application file for complete search history.

(56) References Cited

U.S. PATENT DOCUMENTS

| | | | |
|---|---|---|---|
| 2014/0077205 A1 | 3/2014 | Yamazaki et al. | |
| 2014/0113405 A1 | 4/2014 | Tsubuku et al. | |
| 2014/0284599 A1* | 9/2014 | Yamazaki | H10D 62/235 |
| | | | 257/43 |
| 2015/0084043 A1 | 3/2015 | Ishihara et al. | |
| 2015/0236165 A1* | 8/2015 | Tsubuku | H10D 30/6758 |
| | | | 257/43 |
| 2017/0236844 A1 | 8/2017 | Yamazaki et al. | |
| 2017/0278973 A1* | 9/2017 | Ando | H10D 99/00 |
| 2020/0411694 A1 | 12/2020 | Koezuka et al. | |
| 2021/0126115 A1 | 4/2021 | Koezuka et al. | |

FOREIGN PATENT DOCUMENTS

| | | | |
|---|---|---|---|
| JP | 2018006730 | A | 1/2018 |
| JP | 2021108405 | A | 7/2021 |
| JP | 2021141338 | A | 9/2021 |
| JP | 2021153196 | A | 9/2021 |
| KR | 1020200134262 | | 12/2020 |
| KR | 1020210027366 | A | 3/2021 |

OTHER PUBLICATIONS

English machine translation of Office Action dated Jul. 11, 2025, issued in German Application No. 10 2023 208 538.0, 2 pages.
English machine translation of Office Action issued on Jul. 25, 2024, in corresponding Korean Application No. 1020230112808, 6 pages.

* cited by examiner

P

Example 1

Example 2

Comparative Example 1

Comparative Example 2

SEMICONDUCTOR DEVICE

This application claims the benefit of priority to Japanese Patent Application No. 2022-143864, filed on Sep. 9, 2022, the entire contents of which are incorporated herein by reference.

FIELD

An embodiment of the present invention relates to a semiconductor device using an oxide semiconductor as a channel.

BACKGROUND

In recent years, a semiconductor device in which an oxide semiconductor is used for a channel instead of a silicon semiconductor such as amorphous silicon, low-temperature polysilicon, and single-crystal silicon, etc. has been developed (for example, see Japanese laid-open patent publication No. 2021-141338, Japanese laid-open patent publication No. 2014-099601, Japanese laid-open patent publication No. 2021-153196, Japanese laid-open patent publication No. 2018-006730, Japanese laid-open patent publication No. 2016-184771, and Japanese laid-open patent publication No. 2021-108405). A semiconductor device including such an oxide semiconductor can be formed with a simple structure and a low-temperature process, similar to a semiconductor device including amorphous silicon. The semiconductor device including the oxide semiconductor is known to have higher field effect mobility than the semiconductor device including amorphous silicon.

SUMMARY

A semiconductor device according to an embodiment of the present invention includes an oxide insulating layer, an oxide semiconductor layer on the oxide insulating layer, a gate insulating layer on the oxide insulating layer and the oxide semiconductor layer, a gate electrode on the gate insulating layer, and a protective insulating layer on the gate insulating layer and the gate electrode. The gate insulating layer covers the oxide semiconductor layer. The gate insulating layer includes a first region overlapping the gate electrode and a second region not overlapping the gate electrode. The second region is in contact with the protective insulating layer. The oxide insulating layer includes a third region overlapping the gate electrode and a fourth region not overlapping the gate electrode and the oxide semiconductor layer. The fourth region is in contact with the gate insulating layer. The oxide semiconductor layer includes a channel region, a source region, and a drain region. The source region and the drain region have a greater carrier concentration than the channel region. Each of the source region, the drain region, and the second region contains an impurity. A hydrogen concentration of the second region is greater than a hydrogen concentration of the first region.

DESCRIPTION OF EMBODIMENTS

Figure 1:
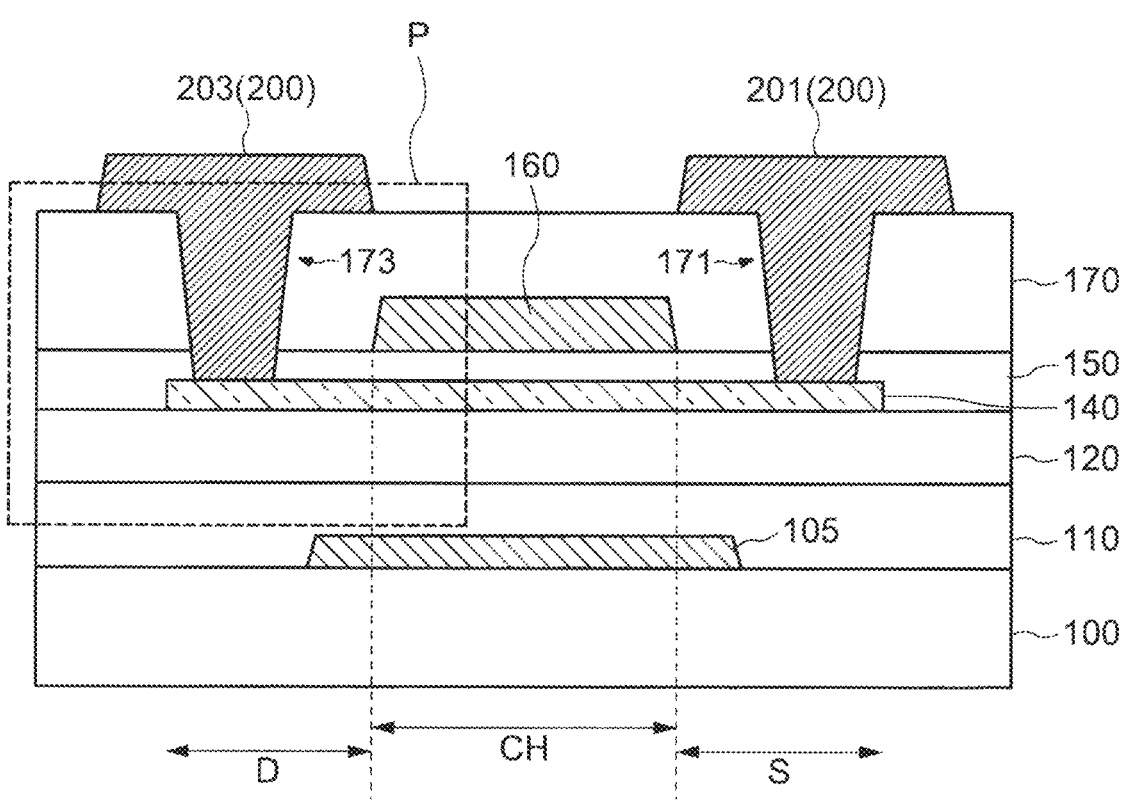
FIG. 1 is a schematic cross-sectional view showing a configuration of a semiconductor device according to an embodiment of the present invention.

In an oxide semiconductor, a carrier is generated when hydrogen is trapped in an oxygen defect. Utilizing this mechanism, in a semiconductor device, an oxygen defect is formed in an oxide semiconductor layer, and hydrogen is supplied to the formed oxygen defect, whereby a source region and a drain region, which are electrically connected to a source electrode and a drain electrode and have a higher carrier concentration than a channel region, are formed in the oxide semiconductor layer. However, when hydrogen diffuses into the channel region of the oxide semiconductor layer, the oxide semiconductor layer does not function as a channel. That is, since the threshold voltage in the electrical characteristics of the semiconductor device changes due to the diffusion of hydrogen into the channel region, the variations in the threshold voltage is increased and the manufacturing yield of the semiconductor device is reduced. Therefore, an oxide containing excess oxygen capable of trapping hydrogen is used for an insulating layer in contact with the oxide semiconductor layer to prevent hydrogen from entering the channel region.

However, since the oxide containing excess oxygen functions as an electron trap, the reliability of the semiconductor device including such an oxide is significantly reduced. Therefore, there is a demand for a semiconductor device that can supply hydrogen to the source region and the drain region of the oxide semiconductor layer and prevent hydrogen from entering the channel region of the oxide semiconductor layer without reducing the reliability.

In view of the above problem, one object of an embodiment of the present invention is to provide a semiconductor device including a hydrogen trap region that prevents hydrogen from entering a channel region.

Each embodiment of the present invention is described below with reference to the drawings. The following disclosure is merely an example. A configuration that can be easily conceived by a person skilled in the art by appropriately changing the configuration of the embodiment while maintaining the gist of the invention is naturally included in the scope of the present invention. For the sake of clarity of description, the drawings may be schematically represented with respect to widths, thicknesses, shapes, and the like of the respective portions in comparison with actual embodiments. However, the shape shown is merely an example and does not limit the interpretation of the present invention. In this specification and each of the drawings, the same symbols are assigned to the same components as those described previously with reference to the preceding drawings, and a detailed description thereof may be omitted as appropriate.

In the specification, a direction from a substrate to an oxide semiconductor layer is referred to as "on" or "over".

Reversely, a direction from the oxide semiconductor layer to the substrate is referred to as "under" or "below". As described above, for convenience of explanation, although the phrase "over (on)" or "below (under)" is used for explanation, for example, a vertical relationship between the substrate and the oxide semiconductor layer may be arranged in a different direction from that shown in the drawing. In the following description, for example, the expression "the oxide semiconductor layer on the substrate" merely describes the vertical relationship between the substrate and the oxide semiconductor layer as described above, and other members may be arranged between the substrate and the oxide semiconductor layer. Over or below means a stacking order in a structure in which multiple layers are stacked, and when it is expressed as a pixel electrode above a semiconductor device, it may be a positional relationship where the semiconductor device and the pixel electrode do not overlap each other in a plan view. On the other hand, when it is expressed as a pixel electrode vertically above a semiconductor device, it means a positional relationship where the semiconductor device and the pixel electrode overlap each other in a plan view.

In the specification, the terms "film" and "layer" may be interchangeably used.

In the specification, "display device" refer to a structure configured to display an image using an electro-optic layer. For example, the term display device may refer to a display panel including the electro-optic layer, or it may refer to a structure in which other optical members (e.g., a polarizing member, a backlight, or a touch panel, etc.) are attached to a display cell. The "electro-optical layer" may include a liquid crystal layer, an electroluminescent (EL) layer, an electrochromic (EC) layer, or an electrophoretic layer as long as there is no technical contradiction. Therefore, although examples of a liquid crystal display device including a liquid crystal layer and an organic EL display device including an organic EL layer are described as the display device in the following embodiments, the structure of the present embodiment may be applied to the above display device including any electro-optic layer.

The expressions "α includes A, B, or C", "a includes any of A, B, and C", and "a includes one selected from a group consisting of A, B, and C" do not exclude the case where a includes multiple combinations of A to C unless otherwise specified. Furthermore, these expressions do not exclude the case where a includes other elements.

In addition, the following embodiments may be combined with each other as long as there is no technical contradiction.

First Embodiment

A semiconductor device 10 according to an embodiment of the present invention is described with reference to FIG. 1 to FIG. 15. The semiconductor device can be used in, for example, a display device, an integrated circuit (IC) such as a micro-processing unit (MPU), or a memory circuit.

[1. Configuration of Semiconductor Device 10]

Figure 2:
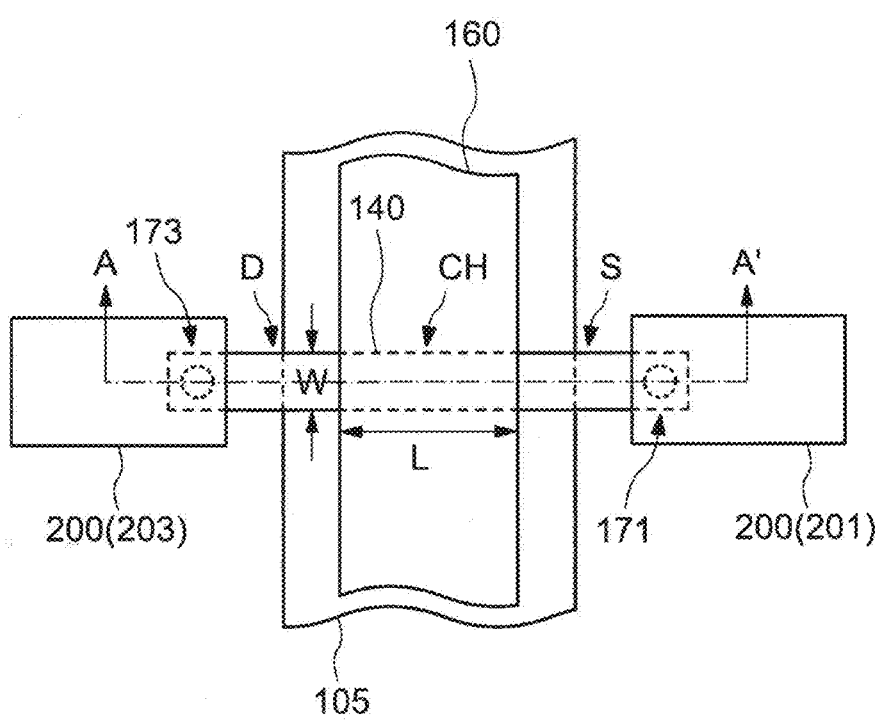
FIG. 2 is a schematic plan view showing a configuration of a semiconductor device according to an embodiment of the present invention.
Figure 2:
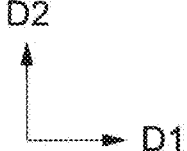

A configuration of the semiconductor device 10 according to an embodiment of the present invention is described with reference to FIGS. 1 and 2. FIG. 1 is a schematic cross-sectional view showing a configuration of the semiconductor device 10 according to an embodiment of the present invention. FIG. 2 is a schematic plan view showing a configuration of the semiconductor device 10 according to an embodiment of the present invention. Specifically, FIG. 1 is a cross-sectional view cut along the line A-A' of FIG. 2.

As shown in FIG. 1, the semiconductor device 10 includes a substrate 100, a light shielding layer 105, a nitride insulating layer 110, an oxide insulating layer 120, an oxide semiconductor layer 140, a gate insulating layer 150, a gate electrode 160, a protective insulating layer 170, a source electrode 201, and a drain electrode 203. The light shielding layer 105 is provided on the substrate 100. The nitride insulating layer 110 is provided on the substrate 100 to cover an upper surface and an end surface of the light shielding layer 105. The oxide insulating layer 120 is provided on the nitride insulating layer 110. The oxide semiconductor layer 140 is provided on the oxide insulating layer 120. The gate insulating layer 150 is provided on the second insulating layer 120 to cover an upper surface and an end surface of the oxide semiconductor layer 140. The gate electrode 160 is provided on the gate insulating layer 150 to overlap the oxide semiconductor layer 140. The protective insulating layer 170 is provided on the gate insulating layer 150 to cover an upper surface and an end surface of the gate electrode 160. Opening portions 171 and 173 through which a part of the upper surface of the oxide semiconductor layer is exposed are provided in the gate insulating layer 150 and the protective insulating layer 170. The source electrode 201 is provided on the protective insulating layer 170 and inside the opening portion 171 and is in contact with the oxide semiconductor layer 140. Similarly, the drain electrode 203 is provided on the protective insulating layer 170 and inside the opening portion 173 and is in contact with the oxide semiconductor layer 140. In addition, hereinafter, when the source electrode 201 and the drain electrode 203 are not particularly distinguished, they may be collectively referred to as a source/drain electrode 200.

The oxide semiconductor layer 140 is divided into a source region S, a drain region D, and a channel region CH based on the gate electrode 160. That is, the oxide semiconductor layer 140 includes the channel region CH which overlaps the gate electrode 160 and the source region S and the drain region D which do not overlap the gate electrode 160. In the thickness direction of the oxide semiconductor layer 140, an edge portion of the channel region CH substantially coincides with an edge portion of the gate electrode 160. The channel region CH has properties of a semiconductor. Each of the source region S and the drain region D has properties of a conductor. Therefore, the electrical conductivities of the source region S and the drain region D are greater than the electrical conductivity of the channel region CH. The source electrode 201 and the drain electrode 203 are in contact with the source region S and the drain region D, respectively, and are electrically connected to the oxide semiconductor layer 140. Further, the oxide semiconductor layer 140 may have a single layer structure or a laminated structure.

As shown in FIG. 2, each of the light shielding layer 105 and the gate electrode 160 has a predetermined width in a direction D1 and extends in a direction D2 orthogonal to the direction D1. A width of the light shielding layer 105 is greater than a width of the gate electrode 160 in the direction D1. The channel region CH completely overlaps the light shielding layer 105. In the semiconductor device 10, the direction D1 corresponds to the direction in which current flows from the source electrode 201 to the drain electrode 203 through the oxide semiconductor layer 140. Therefore, a length of the channel region CH in the direction D1 is a channel length L, and a width of the channel region CH in the direction D2 is a channel width W.

The substrate 100 can support each layer in the semiconductor device 10. For example, a rigid substrate with translucency such as a glass substrate, a quartz substrate, or a sapphire substrate can be used as the substrate 100. Further, a rigid substrate without translucency such as a silicon substrate can be used as the substrate 100. Furthermore, a flexible substrate with translucency such as a polyimide resin substrate, an acrylic resin substrate, a siloxane resin substrate, or a fluorine resin substrate can be used as the substrate 100. In order to improve the heat resistance of the substrate 100, impurities may be introduced into the resin substrate. In addition, a substrate in which a silicon oxide film or a silicon nitride film is formed over the rigid substrate or the flexible substrate described above can be used as the substrate 100.

The light shielding layer 105 can reflect or absorb external light. As described above, since the light shielding layer 105 has a larger area than the channel region CH of the oxide semiconductor layer 140, the light shielding layer 105 can block external light entering the channel region CH. For example, aluminum (Al), copper (Cu), titanium (Ti), molybdenum (Mo), tungsten (W), or alloys or compounds thereof can be used for the light shielding layer 105. Further, the light shielding layer 105 may not necessarily include a metal when conductivity of the light shielding layer 105 is not required. For example, a black matrix made of black resin can be used for the light shielding layer 105. Furthermore, the light shielding layer 105 may have a single layer structure or a laminated structure. For example, the light shielding layer 105 may have a laminated structure of a red color filter, a green color filter, and a blue color filter.

The nitride insulating layer 110 can prevent the diffusion of impurities (e.g., sodium etc.) contained in the substrate 100 or impurities (e.g., water etc.) entering from the outside into the oxide semiconductor layer 140. For example, a nitride containing silicon or aluminum is used for the nitride insulating layer 110. Specifically, silicon nitride ($SiN_x$), silicon nitride oxide ($SiN_xO_y$), aluminum nitride ($AlN_x$), or aluminum nitride oxide ($AlN_xO_y$) and the like are used for the nitride insulating layer 110. Further, the nitride insulating layer 110 may have a single layer structure or a laminated structure.

Each of the oxide insulating layer 120 and the gate insulating layer 150 includes a hydrogen trap region and can suppress hydrogen from entering the channel region CH. The details of the hydrogen trap region are described later. For example, an oxide containing silicon or aluminum is used for each of the oxide insulating layer 120 and the gate insulating layer 150. Specifically, silicon oxide ($SiO_x$), silicon oxynitride ($SiO_xN_y$), aluminum oxide ($AlO_x$), or aluminum oxynitride ($AlO_xN_y$) and the like are used for the oxide insulating layer 120. Each of the oxide insulating layer 120 and the gate insulating layer 150 may have a single layer structure or a laminated structure.

The protective insulating layer 170 can prevent diffusion of impurities (e.g., water etc.) entering from the outside into the oxide semiconductor layer 140. Further, the protective insulating layer 170 can function as a hydrogen supply source to the source region S and the drain region D. For example, an oxide or a nitride containing silicon or aluminum is used for the protective layer 170. Specifically, the oxide such as silicon oxide ($SiO_x$), silicon oxynitride ($SiO_xN_y$), aluminum oxide ($AlO_x$), or aluminum oxynitride ($AlO_xN_y$), or the nitride such as silicon nitride ($SiN_x$), silicon nitride oxide ($SiN_xO_y$), aluminum nitride ($AlN_x$), or aluminum nitride oxide ($AlN_xO_y$) and the like are used for the protective layer 170. The protective layer 170 may have a single layer structure or a laminated structure. In addition, when the protective layer 170 has a laminated structure, it is preferable that the protective layer 170 has a laminated structure (nitride/oxide) in which the nitride is stacked on the oxide.

Here, silicon oxynitride ($SiO_xN_y$) and aluminum oxynitride ($AlO_xN_y$) are oxides that contain a smaller proportion (x>y) of nitrogen (N) than oxygen (O). Silicon nitride oxide ($SiN_xO_y$) and aluminum nitride oxide ($AlN_xO_y$) are nitrides that contain a smaller proportion (x>y) of oxygen than nitrogen.

The gate electrode 160, the source electrode 201, and the drain electrode 203 are conductive. For example, copper (Cu), aluminum (Al), titanium (Ti), chromium (Cr), cobalt (Co), nickel (Ni), molybdenum (Mo), hafnium (Hf), tantalum (Ta), tungsten (W), or bismuth (Bi), or alloys or compounds thereof can be used for each of the gate electrode 160, the source electrode 201, and the drain electrode 203. Each of the gate electrode 160, source electrode 201, and drain electrode 203 may have a single layer structure or a laminated structure.

The oxide semiconductor layer 140 may have an amorphous structure or a polycrystalline structure.

Although a detailed method for manufacturing the oxide semiconductor layer 140 is described later, the oxide semiconductor layer 140 can be formed using a sputtering method. The composition of the oxide semiconductor layer 140 formed by sputtering depends on the composition of the sputtering target. In this case, the composition of the metal elements in the oxide semiconductor layer 140 can be specified based on the composition of the metal elements in the sputtering target. Further, when the oxide semiconductor layer 140 has a polycrystalline structure, the composition of the oxide semiconductor layer 140 may be specified by an X-ray diffraction (XRD) method. Specifically, the composition of the metal elements in the oxide semiconductor layer 140 can be specified based on the crystal structure and lattice constant of the oxide semiconductor layer 140 obtained by the XRD method. Furthermore, the composition of the metal elements of the oxide semiconductor layer 140 can also be identified using fluorescent X-ray analysis, electron probe microanalyzer (EPMA) analysis, or the like. In addition, oxygen contained in the oxide semiconductor layer 140 is not limited to this because oxygen changes depending on the sputtering process conditions and the like.

[2. Configuration of Hydrogen Trap Region]

Figure 3:
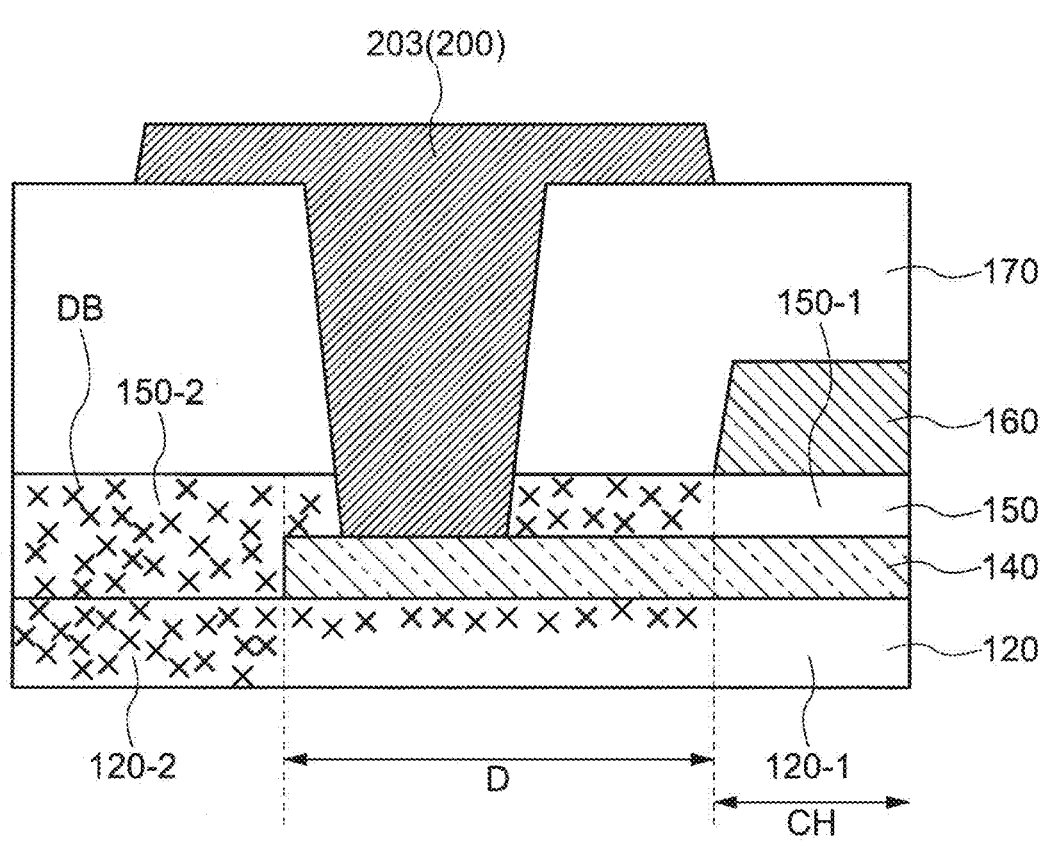
FIG. 3 is a schematic partially enlarged cross-sectional view showing a configuration of a semiconductor device according to an embodiment of the present invention.

A hydrogen trap region is formed in the oxide insulating layer 120 and the gate insulating layer 150. Here, structures of the oxide insulating layer 120 and the gate insulating layer 150 are further described with reference to FIGS. 3 and 4. FIG. 3 is a schematic partial enlarged cross-sectional view showing a configuration of the semiconductor device 10 according to an embodiment of the present invention. Specifically, FIG. 3 is an enlarged cross-sectional view of a region P in FIG. 1. In addition, although the region P shown in FIG. 3 is the region near the drain region D, the region near the source region S also has the same structure as the region P.

The gate insulating layer 150 includes a first region 150-1 and a second region 150-2. The first region 150-1 is a region that overlaps the gate electrode 160 in the film thickness direction of the gate insulating layer 150 (in the plan view of the semiconductor device 10). In other words, the first region 150-1 is a region in contact with the channel region CH of the oxide semiconductor layer 140 and the gate electrode 160. The second region 150-2 is a region that does not overlap the gate electrode 160 and the oxide semiconductor layer 140 in the film thickness direction of the gate insulating layer 150 (or in the plan view of the semiconductor device 10). In other words, the second region 150-2 is a region located outside the drain region D of the oxide semiconductor layer 140 and in contact with the protective insulating layer 170 and the oxide insulating layer 120.

The oxide insulating layer 120 includes a third region 120-1 and a fourth region 120-2. The third region 120-1 is a region that overlaps the gate electrode 160 in the thickness direction of the oxide insulating layer 120 (or in the plan view of the semiconductor device 10). In other words, the third region 120-1 is a region in contact with the channel region CH of the oxide semiconductor layer 140. The fourth region 120-2 is a region that does not overlap the gate electrode 160 and the oxide semiconductor layer 140 in the thickness direction of the oxide insulating layer 120 (or in the plan view of the semiconductor device 10). In other words, the fourth region 120-2 is a region located outside the drain region D of the oxide semiconductor layer 140 and in contact with the gate insulating layer 150.

The first region 150-1 and the third region 120-1 face each other with the channel region CH of the oxide semiconductor layer 140 interposed therebetween. Further, the second region 150-2 and the fourth region 120-2 are in contact with each other outside the drain region D of the oxide semiconductor layer 140.

Although the details are described later, the source region S and the drain region D of the oxide semiconductor layer 140 are formed by ion implantation of an impurity using the gate electrode 160 as a mask. For example, boron (B), phosphorus (P), argon (Ar), nitrogen (N), or the like is used as the impurity. Oxygen defects are generated in the source region S and the drain region D of the oxide semiconductor layer 140 by the ion implantation. The resistance of the source region S and the drain region D is reduced by trapping hydrogen in the generated oxygen defects.

Since the ion implantation is performed through the gate insulating layer 150, the ion implantation creates dangling bond defects DB in the gate insulating layer 150. The ion implantation also generates dangling bond defects DB in the oxide insulating layer 120. As described above, since the ion implantation of the impurity is performed using the gate electrode 160 as a mask, the impurity is not implanted into the region that overlaps the gate electrode 160 and the dangling bond defects DB are not generated in the region. That is, as shown in FIG. 3, the first region 150-1 and the third region 120-1 that overlap the gate electrode 160 do not include the dangling bond defects DB. On the other hand, the second region 150-2 and the fourth region 120-2 that do not overlap the gate electrode 160 include the dangling bond defects DB. For example, when silicon oxide is used as the gate insulating layer 150 and the oxide insulating layer 120, the dangling bond defects DB of silicon are formed in the second region 150-2 and the fourth region 120-2.

The dangling bond defects DB in the second region 150-2 and the fourth region 120-2 can trap hydrogen. That is, in the semiconductor device 10, the second region 150-2 and the fourth region 120-2 can function as hydrogen trap regions. Therefore, the hydrogen concentration in the second region 150-2 is greater than the hydrogen concentration in the first region 150-1. Similarly, the hydrogen concentration in fourth region 120-2 is greater than the hydrogen concentration in the third region 120-1.

The second region 150-2 and the fourth region 120-2 contain the impurity implanted by the ion implantation. The ion implantation is performed based on the concentration profile of the impurity, and the impurity concentration distribution contained in the second region 150-2 and the fourth region 120-2 corresponds to the concentration profile.

Therefore, the amount of dangling bond defects in the second region 150-2 and the fourth region 120-2 can be controlled based on the concentration profile.

Figure 4:
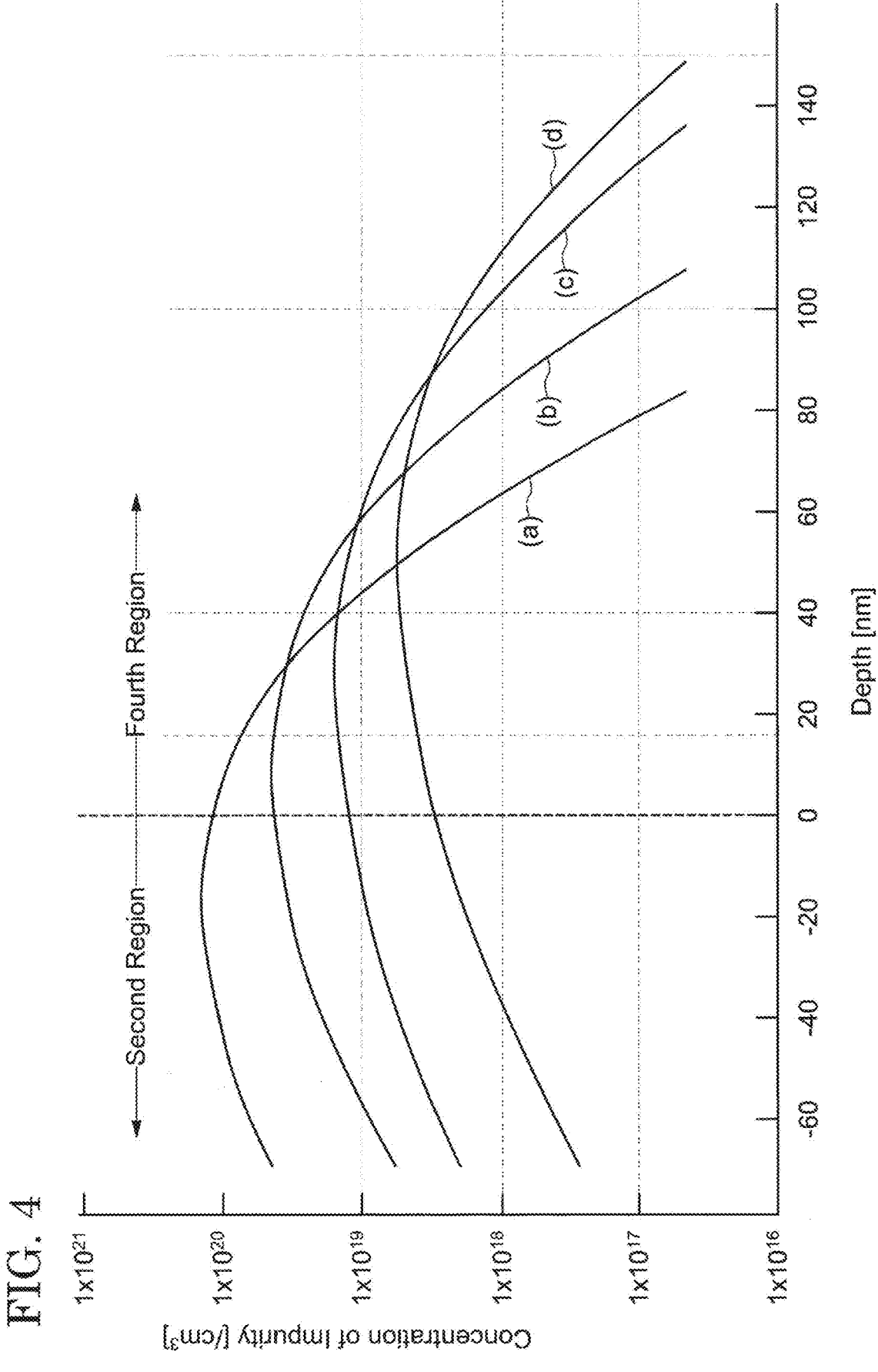
FIG. 4 is a graph showing concentration profiles of ion implantation of an impurity into a second region and a fourth region in a semiconductor device according to an embodiment of the present invention.

FIG. 4 is a graph showing concentration profiles of ion implantation of an impurity into the second region 150-2 and the fourth region 120-2 in the semiconductor device 10 according to an embodiment of the present invention. On the horizontal axis of FIG. 4, 0 nm corresponds to the interface between the second region 150-2 and the fourth region 120-2 (or the interface between the gate insulating layer 150 and the oxide insulating layer 120), the depth of the fourth region 120-2 is represented in the positive direction, and the depth of the second region 150-2 is represented in the negative direction. In other words, the positive direction represents the position from the interface in the fourth region 120-2, and the negative direction represents the position from the interface in the second region 150-2. FIG. 4 shows four different concentration profiles (a) to (d).

It is necessary to form the dangling bond defects DB having a predetermined defect amount in order for the hydrogen trap region to function to suppress the entrance of hydrogen into the channel region CH of the oxide semiconductor layer 140. Further, it is preferable that the impurity is implanted not only to the gate insulating layer 150 located over the oxide semiconductor layer 140 but also into the oxide insulating layer 120 located below the oxide semiconductor layer 140 to form the dangling bond defects DB. That is, by forming hydrogen trap regions including the dangling bond defects DB having a predetermined defect amount in the gate insulating layer 150 and the oxide insulating layer 120, the electrical characteristics of the semiconductor device 10 can be improved.

A peak of the concentration profile of the impurity may be in the second region 150-2 or may be in the fourth region 120-2. In FIG. 4, the concentration profile (a) has a peak in the second region 150-2 and the concentration profiles (b) to (d) have peaks in the fourth region 120-2.

In the fourth region 120-2, the concentration of the impurity at the position of +16 nm (that is, the position 16 nm away from the interface in the thickness direction of the oxide insulating layer 120) is greater than or equal to $1\times10^{18}/cm^3$ (see the concentration profiles (a) to (d)), and preferably $5\times10^{18}/cm^3$ (see the concentration profiles (a) to (c)).

Further, in the fourth region 120-2, the concentration of the impurity at the position of +40 nm (that is, the position 40 nm away from the interface in the thickness direction of the oxide insulating layer 120) is greater than or equal to $1\times10^{16}/cm^3$, preferably greater than or equal to $1\times10^{17}/cm^3$, and more preferably greater than or equal to $1\times10^{18}/cm^3$. All of the concentration profiles (a) to (d) shown in FIG. 4 satisfy the above ranges.

Further, in the fourth region 120-2, the concentration of the impurity in the region from 0 nm to +40 nm (that is, the region from the interface to the position 40 nm away in the thickness direction of the oxide insulating layer 120) is greater than or equal to $1\times10^{16}/cm^3$. Preferably, in the fourth region, the concentration of the impurity in the region from 0 nm to +100 nm (that is, the region from the interface to the position 100 nm away in the thickness direction of the oxide insulating layer 120) is greater than or equal to $1\times10^{16}/cm^3$. More preferably, in the fourth region, the concentration of the impurity in the region from 0 nm to +150 nm (that is, the region from the interface to the position 150 nm away in the film thickness direction of the oxide insulating layer 120) is greater than or equal to $1\times10^{16}/cm^3$. All of the concentration profiles (a) to (d) shown in FIG. 4 satisfy the above ranges.

In addition, when the thickness of the oxide insulating layer 120 is less than 100 nm, the above range may exceed the thickness of the oxide insulating layer 120. In that case, the total film thickness of the oxide insulating layer 120 and the nitride insulating layer 110 may be within the above ranges. That is, the impurity may be implanted into the nitride insulating layer 110. However, it is preferable to adjust conditions of the ion implantation so that the maximum concentration of the impurity in the nitride insulating layer 110 is less than or equal to $1\times10^{19}/cm^3$.

When the concentration of the impurity in fourth region 120-2 is within the above range, the dangling bond defects DB having a sufficient defect amount are formed in the gate insulating layer 150 and the oxide insulating layer 120. That is, since the gate insulating layer 150 and the oxide insulating layer 120 include hydrogen trap regions, the electrical characteristics of the semiconductor device 10 can be improved.

The configuration of the semiconductor device 10 is described above, and the semiconductor device 10 described above is a so-called top-gate transistor. Various modifications can be applied to the semiconductor device 10. For example, when the light shielding layer 105 has conductivity, the semiconductor device 10 may have a configuration in which the light shielding layer 105 functions as a gate electrode, and the nitride insulating layer 110 and the oxide insulating layer 120 function as gate insulating layers. In this case, the semiconductor device 10 is a so-called dual-gate transistor. Further, when the light shielding layer 105 has conductivity, the light shielding layer 105 may be a floating electrode and may be connected to the source electrode 201. Furthermore, the semiconductor device 10 may be a so-called bottom-gate transistor in which the light shielding layer 105 functions as a main gate electrode.

[3. Manufacturing Method of Semiconductor Device 10]

A method for manufacturing the semiconductor device 10 according to an embodiment of the present invention is described with reference to FIGS. 5 to 13. FIG. is a flow chart showing a method of manufacturing the semiconductor device 10 according to an embodiment of the present invention. FIGS. 6 to 13 are schematic cross-sectional views showing a method of manufacturing the semiconductor device 10 according to an embodiment of the present invention.

Figure 5:
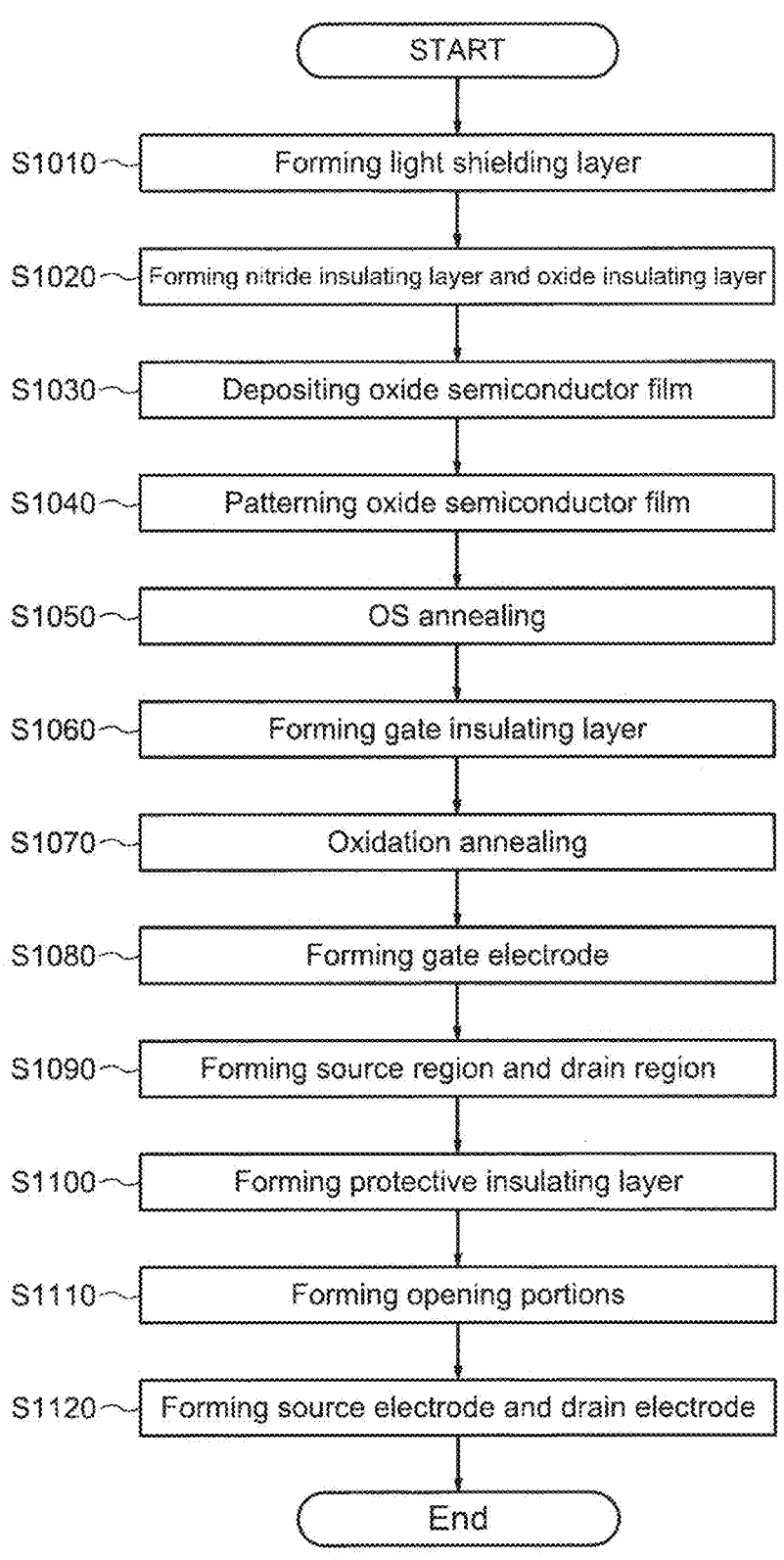
FIG. 5 is a flow chart showing a method for manufacturing a semiconductor device according to an embodiment of the present invention.

As shown in FIG. 5, the method for manufacturing the semiconductor device 10 includes steps S1010 to S1120. In the following description, although steps S1010 to S1120 are described in order, the order of the steps may be interchanged in the method for manufacturing the semiconductor device 10. Further, the method for manufacturing the semiconductor device 10 may include additional steps.

Figure 6:
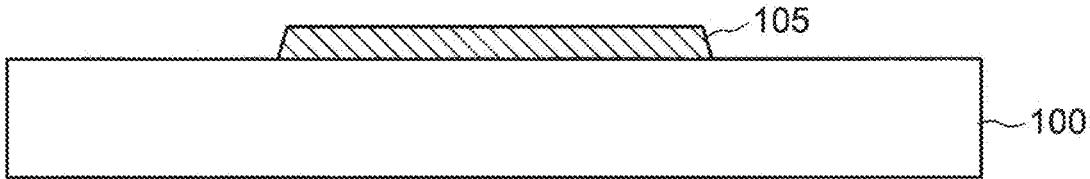
FIG. 6 is a schematic cross-sectional view showing a method for manufacturing a semiconductor device according to an embodiment of the present invention.

In step S1010, the light shielding layer 105 having a predetermined pattern is formed on the substrate 100 (see FIG. 6). The patterning of the light shielding layer 105 is performed using a photolithographic method.

Figure 7:
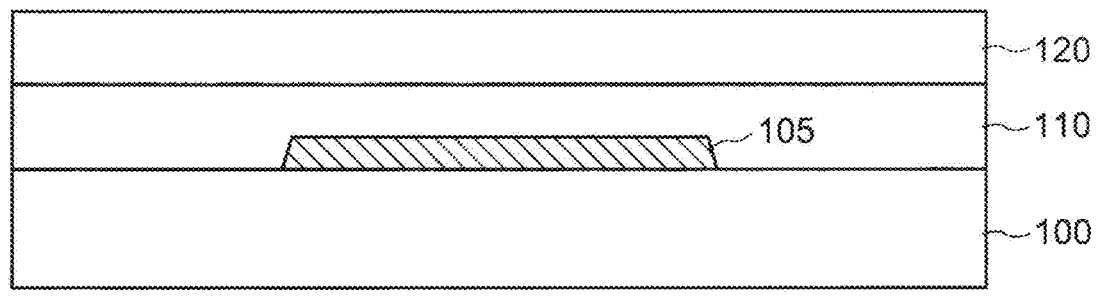
FIG. 7 is a schematic cross-sectional view showing a method for manufacturing a semiconductor device according to an embodiment of the present invention.

In step S1020, the nitride insulating layer 110 and the oxide insulating layer 120 are sequentially formed on the light shielding layer 105 (see FIG. 7). The nitride insulating layer 110 and the oxide insulating layer 120 are deposited using a CVD method. For example, a silicon nitride film and a silicon oxide film are deposited as the nitride insulating layer 110 and the oxide insulating layer 120, respectively. The silicon nitride film and the silicon oxide film can also be formed continuously in the same chamber by changing the reactive gas.

In a step described later, dangling bond defects having a hydrogen trapping function are formed in a predetermined region of the oxide insulating layer 120. Therefore, the oxide insulating layer 120 does not have to be a film containing excess oxygen that traps hydrogen, and is preferably a dense film with few defects that is formed at a temperature higher than or equal to 350° C. When the oxide insulating layer 120 is a film containing excess oxygen, the reliability of the semiconductor device 10 is reduced. On the other hand, the reliability of the semiconductor device 10 can be improved by forming the dense film as the oxide insulating layer 120.

For example, the thickness of the nitride insulating layer 110 is greater than or equal to 50 nm and less than or equal to 500 nm, and preferably greater than or equal to 150 nm and less than or equal to 300 nm. Further, for example, the thickness of the oxide insulating layer 120 is greater than or equal to 50 nm and less than or equal to 500, and preferably greater than or equal to 150 nm and less than or equal to 300 nm.

Figure 8:
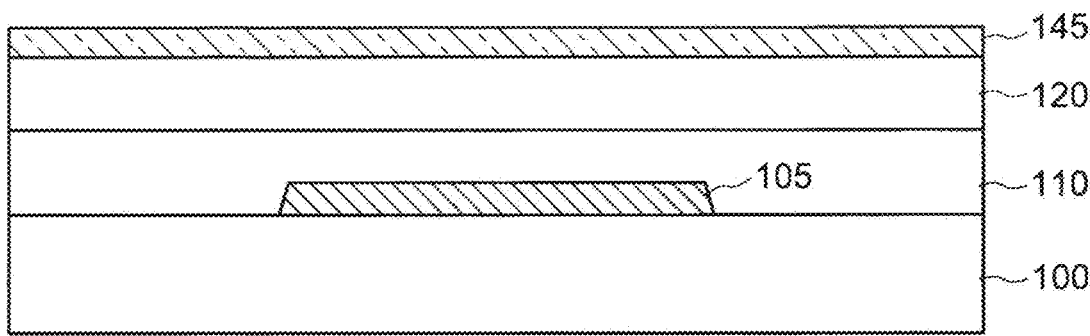
FIG. 8 is a schematic cross-sectional view showing a method for manufacturing a semiconductor device according to an embodiment of the present invention.

In step S1030, an oxide semiconductor film 145 is formed on the oxide insulating layer 120 (see FIG. 8). The oxide semiconductor film 145 is deposited by a sputtering method. For example, the thickness of the oxide semiconductor film 145 is greater than or equal to 10 nm and less than or equal to 100 nm, preferably greater than or equal to 15 nm and less than or equal to 70 nm, and more preferably greater than or equal to 15 nm and less than or equal to 40 nm.

The oxide semiconductor film 145 in step S1030 is amorphous. When the oxide semiconductor film 145 is formed by the sputtering method, the oxide semiconductor film 145 is deposited while controlling the temperature of the object to be deposited (the substrate 100 and the layers formed thereon) to less than or equal to 100° C., preferably less than or equal to 80° C., and preferably less than or equal to 50° C. Further, the oxide semiconductor film 145 is deposited under a condition of low oxygen partial pressure. The oxygen partial pressure is greater than or equal to 2% and less than or equal to 20%, preferably greater than or equal to 3% and less than or equal to 15%, and more preferably greater than or equal to 3% and less than or equal to 10%.

Figure 9:
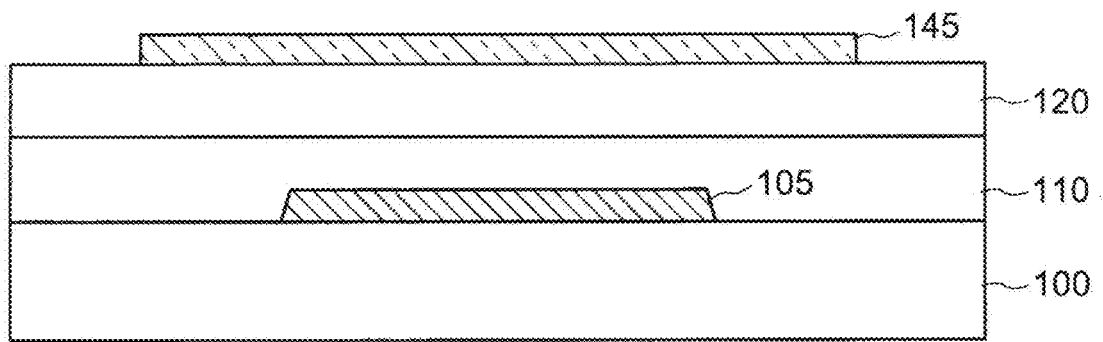
FIG. 9 is a schematic cross-sectional view showing a method for manufacturing a semiconductor device according to an embodiment of the present invention.

In step S1040, the oxide semiconductor film 145 is patterned (see FIG. 9). The patterning of the oxide semiconductor film 145 is performed using a photolithography method. Wet etching or dry etching may be used for the etching of the oxide semiconductor film 145. The wet etching can be performed using an acidic etchant. For example, oxalic acid, PAN, sulfuric acid, hydrogen peroxide solution, hydrofluoric acid, or the like can be used for the etchant.

In step S1050, a heat treatment is performed on the oxide semiconductor film 145. Hereinafter, the heat treatment performed in step S1050 is referred to as "OS annealing". In the OS annealing, the oxide semiconductor film 145 is held at a predetermined reaching temperature for a predetermined time. The predetermined reaching temperature is higher than or equal to 300° C. and lower than or equal to 500° C., and preferably higher than or equal to 350° C. and lower than or equal to 450° C. Further, the holding time at the reaching temperature is greater than or equal to 15 minutes and less than or equal to 120 minutes, and preferably greater than or equal to 30 minutes and less than or equal to 60 minutes. The oxide semiconductor film 145 is crystallized to form the oxide semiconductor layer 140 having a polycrystalline structure by the OS annealing.

Figure 10:
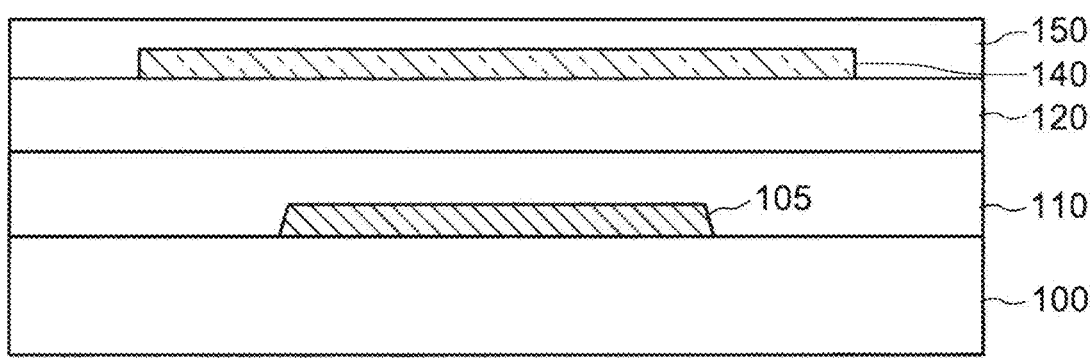
FIG. 10 is a schematic cross-sectional view showing a method for manufacturing a semiconductor device according to an embodiment of the present invention.

In step S1060, the gate insulating layer 150 is deposited on the oxide semiconductor layer 140 (see FIG. 10). The gate insulating layer 150 is deposited using the CVD method. For example, silicon oxide is deposited for the gate insulating layer 150. In order to reduce defects in the gate insulating layer 150, the gate insulating layer 150 may be deposited at a deposition temperature of higher than or equal to 350° C. The thickness of the gate insulating layer 150 is greater than or equal to 50 nm and less than or equal to 300 nm, preferably greater than or equal to 60 nm and less than or equal to 200 nm, and more preferably greater than or equal to 70 nm and less than or equal to 150 nm.

In step S1070, a heat treatment is performed on the oxide semiconductor layer 140. Hereinafter, the heat treatment performed in step S100 is referred to as "oxidation annealing". When the gate insulating layer 150 is formed on the oxide semiconductor layer 140, many oxygen vacancies are generated on the top surface and side surfaces of the oxide semiconductor layer 140. When oxidation annealing is performed, oxygen is supplied to the oxide semiconductor layer 140 through the oxide insulating layer 120 and the gate insulating layer 150, and the oxygen vacancies are repaired.

Figure 11:
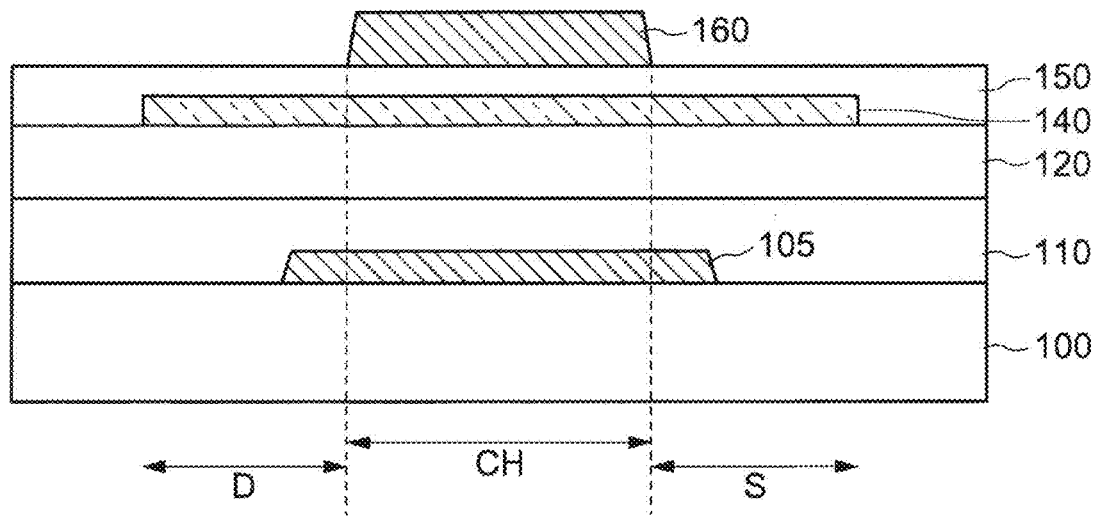
FIG. 11 is a schematic cross-sectional view showing a method for manufacturing a semiconductor device according to an embodiment of the present invention.

In step S1080, the gate electrode 160 having a predetermined pattern is formed on the gate insulating layer 150 (see FIG. 11). The gate electrode 160 is deposited by the sputtering method or an atomic layer deposition method, and patterning of the gate electrode 160 is performed using the photolithographic method.

Figure 12:
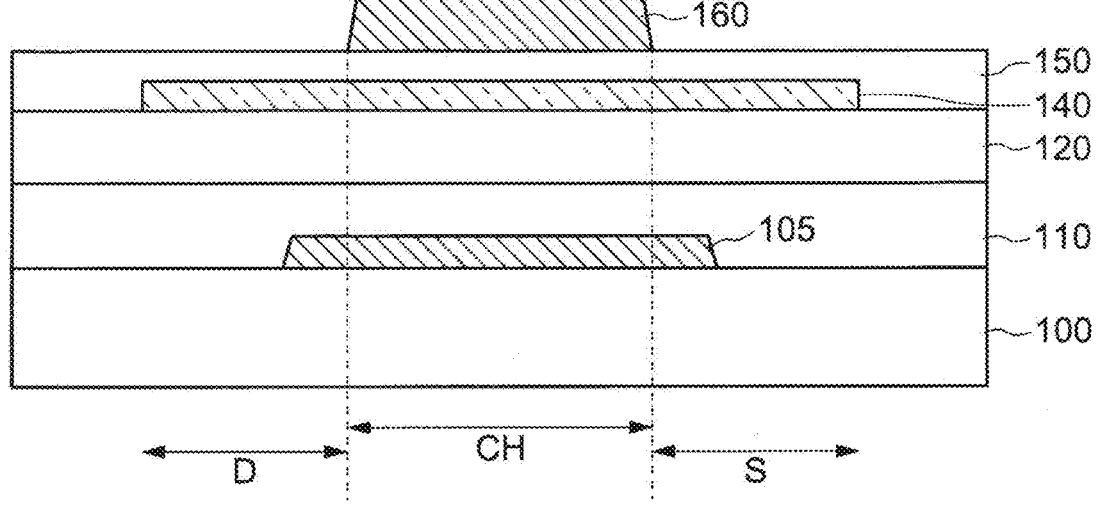
FIG. 12 is a schematic cross-sectional view showing a method for manufacturing a semiconductor device according to an embodiment of the present invention.

In step S1090, the source region S and the drain region D are formed in the oxide semiconductor layer 140 (see FIG. 12). The source region S and the drain region D are formed by the ion implantation. The ion implantation can be performed using an ion doping device or an ion implantation device. Specifically, an impurity is implanted into the oxide semiconductor layer 140 through the gate insulating layer 150 using the gate electrode 160 as a mask. For example, boron (B), phosphorus (P), argon (Ar), nitrogen (N), or the like is used as the implanted impurity. Oxygen vacancies are generated by the ion implantation in the source region S and the drain region D that do not overlap the gate electrode 160, so that hydrogen is trapped in the generated oxygen vacancies. Thereby, the resistance of the source region S and the drain region D is lowered. On the other hand, in the channel region CH that overlaps the gate electrode 160, an impurity is not implanted, so that oxygen vacancies are not generated and the resistance of the channel region CH does not decrease.

Further, in step S1090, the impurity is also implanted into the oxide insulating layer 120 through the gate insulating layer 150. The dangling bond defects DB are generated in the gate insulating layer 150 and the oxide insulating layer 120 by ion implantation. Further, the gate insulating layer 150 and the oxide insulating layer 120 contain the impurity such as boron (B), phosphorus (P), argon (Ar), or nitrogen (N).

Figure 13:
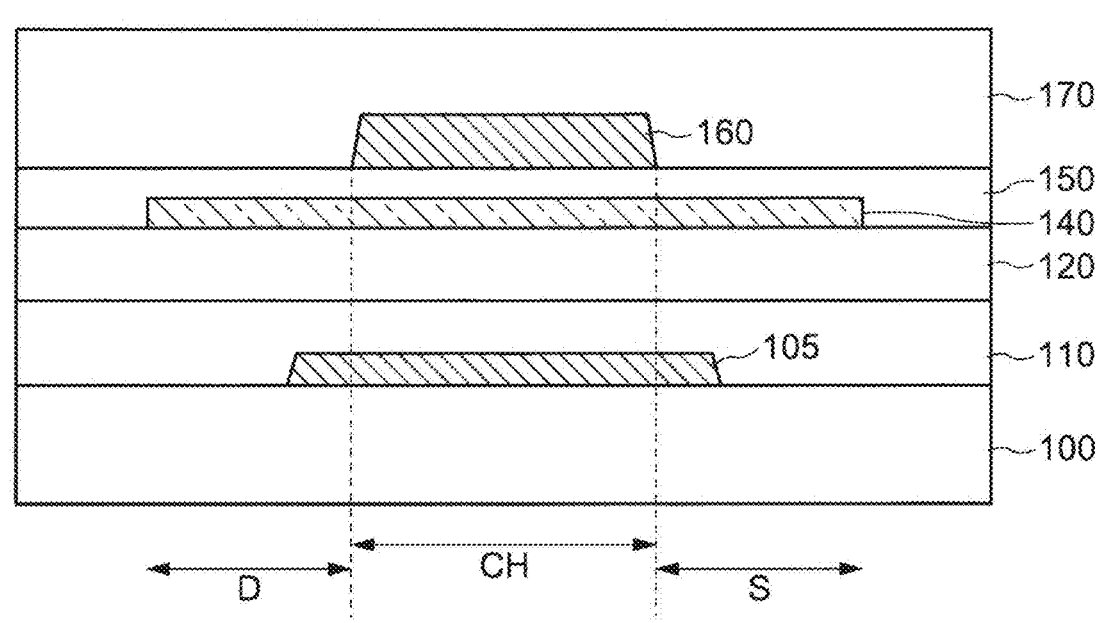
FIG. 13 is a schematic cross-sectional view showing a method for manufacturing a semiconductor device according to an embodiment of the present invention.

In step S1100, the protective insulating layer 170 is formed on the gate insulating layer 150 and the gate electrode 160 (see FIG. 13). The protective insulating layer 170 is deposited using the CVD method. For example, a silicon oxide film and a silicon nitride film are deposited as the protective insulating layer 170. The thickness of the protective insulating layer 170 is greater than or equal to 50 nm and less than or equal to 500 nm.

Figure 15:
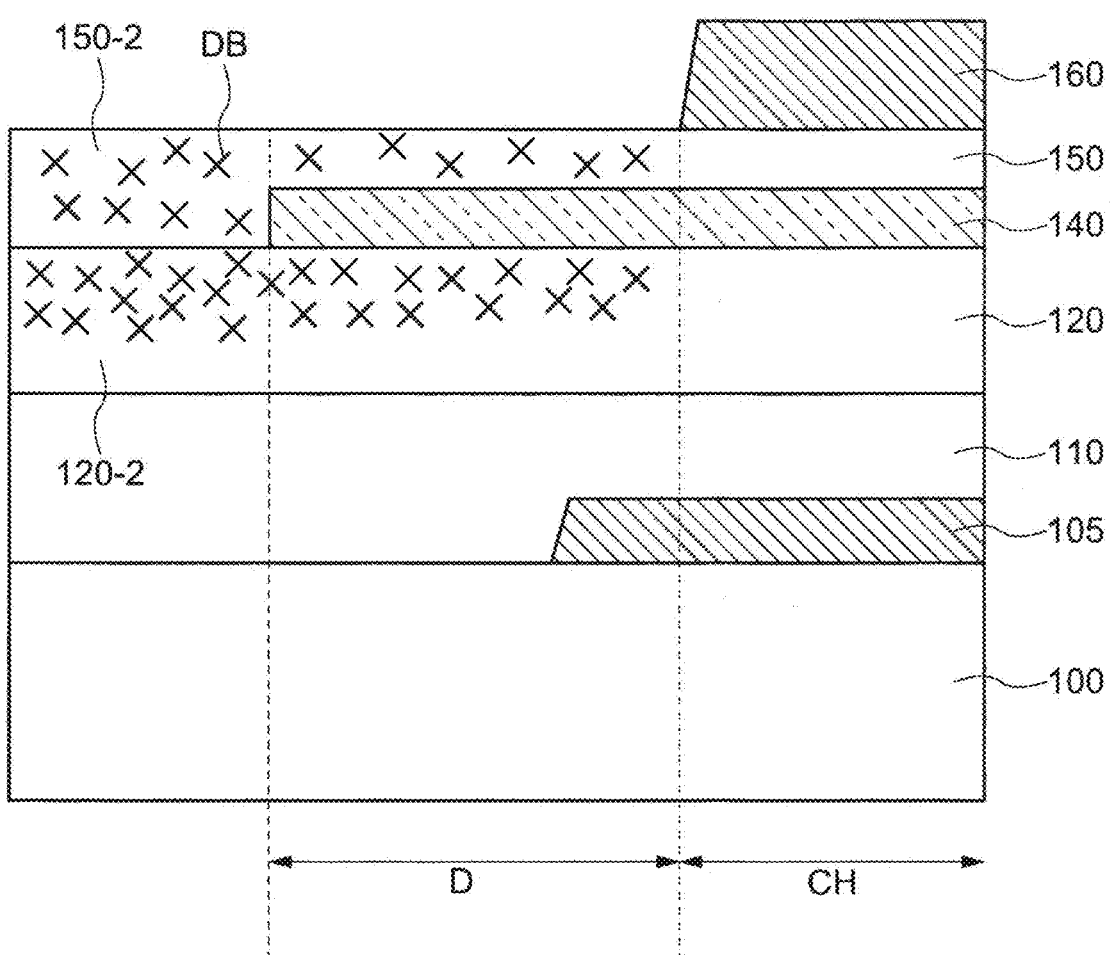
FIG. 15 is a schematic cross-sectional view illustrating a hydrogen trapping function of a second region and a fourth region in a method for manufacturing a semiconductor device according to an embodiment of the present invention.
Figure 16:
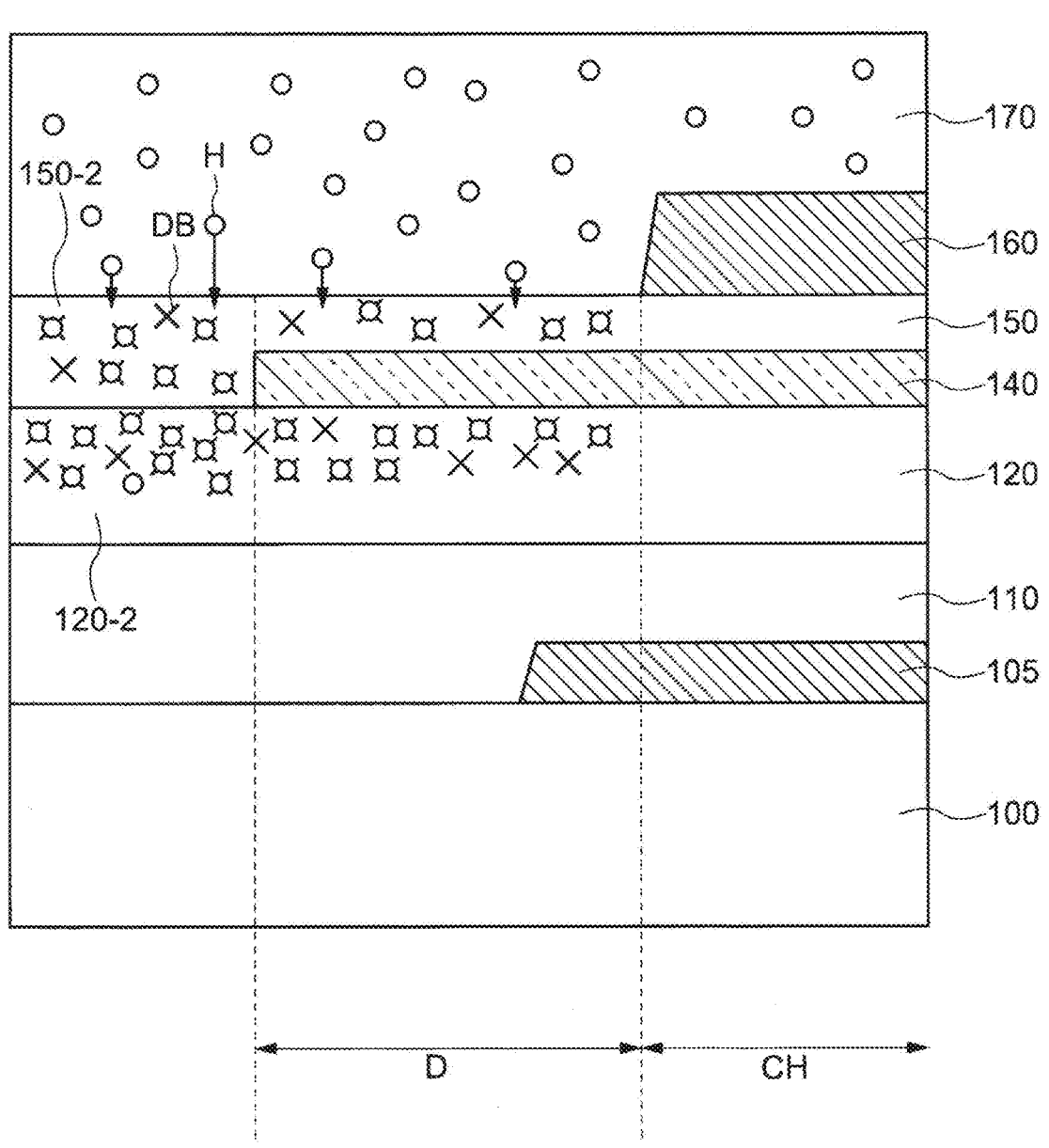
FIG. 16 is a schematic cross-sectional view illustrating a hydrogen trapping function of a second region and a fourth region in a method for manufacturing a semiconductor device according to an embodiment of the present invention.

Here, steps S1090 and S1100 are described in more detail with reference to FIGS. 15 and 16. FIGS. 15 and 16 are schematic cross-sectional views illustrating the hydrogen trap function of the second region 150-2 and the fourth region 120-2 in the method of manufacturing the semiconductor device 10 according to an embodiment of the present invention.

As shown in FIG. 15, when step S1090 is performed, the second region 150-2 and the fourth region 120-2 having the dangling bond defects DB are formed in the gate insulating layer 150 and the oxide insulating layer 120, respectively. The position and defect amount of the dangling bond defects DB can be controlled by adjusting ion implantation process parameters (e.g., dose amount, acceleration voltage, plasma power, etc.). Although the dose amount is greater than or equal to $1\times10^{14}/cm^2$, preferably greater than or equal to $5\times10^{14}/cm^2$, and more preferably greater than or equal to $1\times10^{15}/cm^2$, the dose amount is not limited to this range. Further, the acceleration voltage is greater than 10 keV, preferably greater than or equal to 15 keV, and more preferably greater than or equal to 20 keV. In the second region 150-2 and the fourth region 120-2, the dangling bond defects DB can trap hydrogen. That is, the second region 150-2 and the fourth region 120-2 can function as hydrogen trap regions.

In order for the protective insulating layer 170 to have a function of preventing diffusion of impurities from the outside, it is preferable that the protective insulating layer 170 is a dense film with few defects formed at a temperature higher than or equal to 350° C. The protective insulating layer 170 deposited under the conditions described above usually contains a large amount of hydrogen. Further, since the film formation temperature is high, hydrogen diffuses into the gate insulating layer 150 during the film formation of the protective insulating layer 170. Therefore, when a hydrogen trap region is not formed at least in the gate insulating layer 150, hydrogen diffuses not only into the source region S and the drain region D of the oxide semiconductor layer 140 but also into the channel region CH through the gate insulating layer 150.

As shown in FIG. 16, in step S1100, the second region 150-2 and the fourth region 120-2 are formed in the gate insulating layer 150 and the oxide insulating layer 120, respectively, and the dangling bond defects DB in the second region 150-2 and the fourth region 120-2 trap hydrogen diffusing from the protective insulating layer 170 during the deposition of the protective layer 170. Therefore, the entry of hydrogen into the channel region CH of the oxide semiconductor layer 140 can be suppressed in step S1100. Further, since a dense film containing hydrogen can be used as the protective insulating layer 170, a sufficient amount of hydrogen can be supplied to the source region S and the drain region D having oxygen vacancies.

As described above, the hydrogen trap regions are formed in the gate insulating layer 150 and oxide insulating layer 120 in step S1090, so that the entry of hydrogen into the channel region CH can be suppressed after step S1100. On the other hand, the oxygen defects in the source region S and the drain region D can be supplied with a sufficient amount of hydrogen. Therefore, since variations due to processes are reduced, variations in electrical characteristics of the semiconductor device 10 can be suppressed. In other words, the manufacturing yield of the semiconductor device 10 is improved.

Returning to FIG. 5 again, the steps after step S1110 are described.

Figure 14:
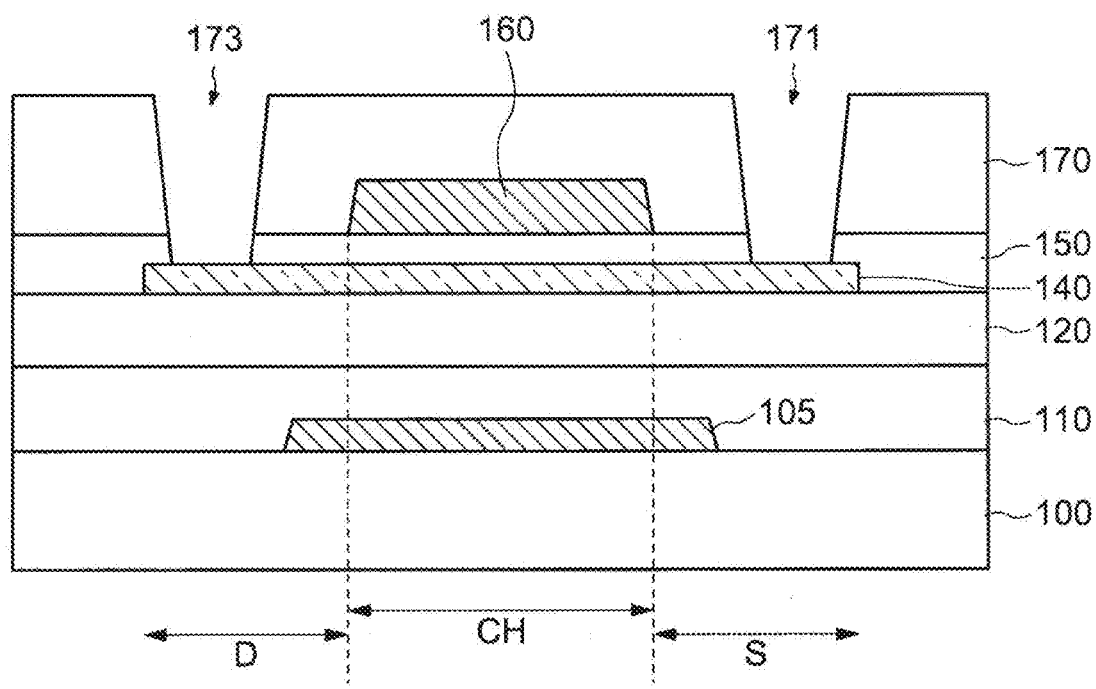
FIG. 14 is a schematic cross-sectional view showing a method for manufacturing a semiconductor device according to an embodiment of the present invention.

In step S1110, the opening portions 171 and 173 are formed in the gate insulating layer 150 and the protective insulating layer 170 (see FIG. 14). The source region S and the drain region D of the oxide semiconductor layer 140 are exposed by forming the opening portions 171 and 173.

In step S1120, the source electrode 201 is formed on the protective insulating layer 170 and inside the opening 171, and the drain electrode 203 is formed on the protective insulating layer 170 and inside the opening 173. The source electrode 201 and the drain electrode 203 are formed as the same layer. Specifically, the source electrode 201 and the drain electrode 203 are formed by patterning one deposited conductive film. Through the above steps, the semiconductor device 10 shown in FIG. 1 is manufactured.

Figure 17:
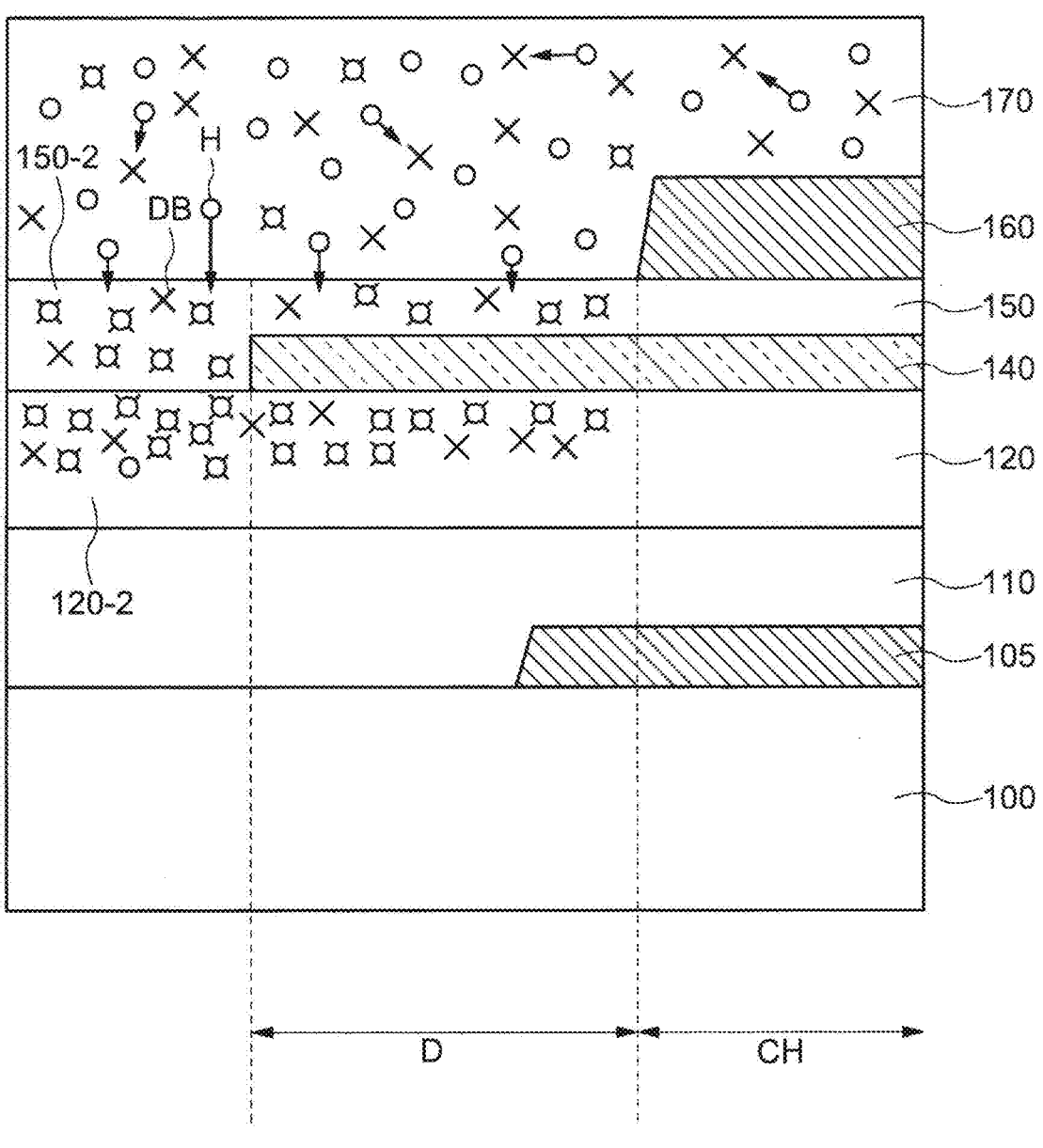
FIG. 17 is a schematic cross-sectional view illustrating a hydrogen trapping function of a protective insulating layer in a method for manufacturing a semiconductor device according to an embodiment of the present invention.

Although the method for manufacturing the semiconductor device 10 has been described above, the method for manufacturing the semiconductor device 10 is not limited to this method. For example, a step of implanting an impurity into the protective insulating layer 170 may be included. Here, the step of implanting an impurity into the protective insulation layer 170 is described with reference to FIG. 17. FIG. 17 is a schematic cross-sectional view illustrating a hydrogen trapping function of the protective insulating layer 170 in a method for manufacturing the semiconductor device according to an embodiment of the present invention.

As shown in FIG. 17, when an impurity is implanted into the protective insulating layer 170, dangling bond defects DB are formed in the protective insulating layer 170. In this case, hydrogen is trapped not only in the dangling bond defects DB in the second region 150-2 and the fourth region 120-2 but also in the dangling bond defects DB in the protective insulating layer 170. That is, the protective insulating layer 170 has a hydrogen trapping function. Therefore, hydrogen contained in the protective insulating layer 170 can be trapped by the dangling bond defects DB in the protective insulating layer 170 and hydrogen can be prevented from diffusing into the gate insulating layer 150. Further, the protective insulating layer 170 can also trap hydrogen entering the protective insulating layer 170 from the outside. Since hydrogen is prevented from diffusing to the channel region CH, the reliability of the semiconductor device 10 is further improved.

In the semiconductor device 10 according to the present embodiment, hydrogen trap regions are formed in the gate insulating layer 150 over the oxide semiconductor layer 140 and in the oxide insulating layer 120 below the oxide semiconductor layer 140. Therefore, in the semiconductor device 10, the entry of hydrogen into the channel region CH of the oxide semiconductor layer 140 can be suppressed. Therefore, since the carrier concentration in the channel region CH can be sufficiently reduced, variations in the threshold voltage in the electrical characteristics of the semiconductor device 10 can be suppressed.

Second Embodiment

Figure 18:
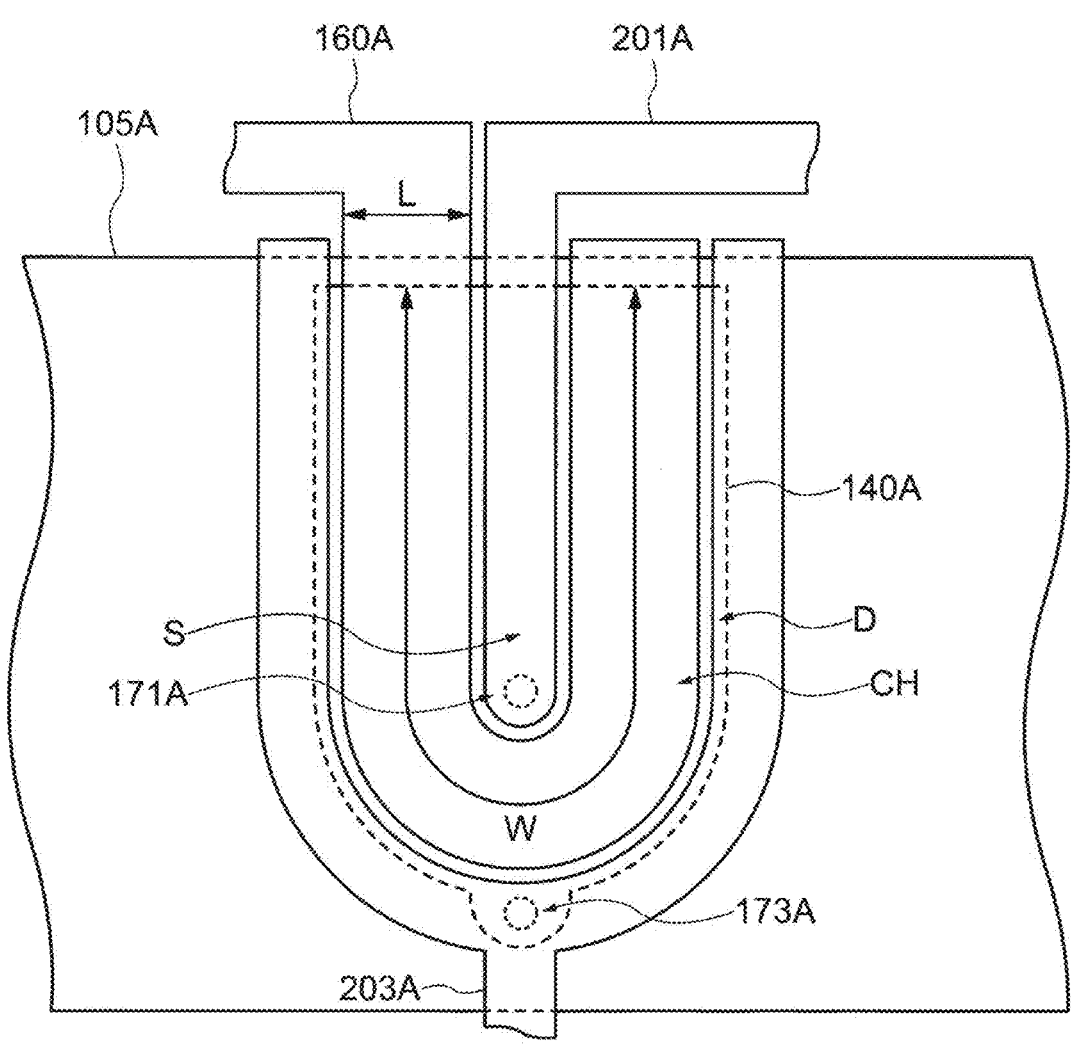
FIG. 18 is a schematic plan view showing a configuration of a semiconductor device according to an embodiment of the present invention.

A semiconductor device 10A according to an embodiment of the present invention is described with reference to FIG. 18. FIG. 18 is a schematic plan view showing a configuration of the semiconductor device 10A according to an embodiment of the invention. When the configuration of the semiconductor device 10A is the same as the configuration of the semiconductor device 10, the description of the configuration of the semiconductor device 10A may be omitted.

As shown in FIG. 18, the semiconductor device 10A includes a light shielding layer 105A, an oxide semiconductor layer 140A, a gate electrode 160A, a source electrode 201A, and a drain electrode 203A. A nitride insulating layer and an oxide insulating layer are formed between the light shielding layer 105A and the oxide semiconductor layer 140A. A gate insulating layer is formed between the oxide semiconductor layer 140A and the gate electrode 160A. A protective insulating layer is formed between the gate electrode 160A and the source electrode 201A and the drain electrode 203A. Since the nitride insulating layer, the oxide insulating layer, the gate insulating layer, and the protective insulating layer are the same as the nitride insulating layer 110, the oxide insulating layer 120, the gate insulating layer 150, and the protective insulating layer 170 described in the First Embodiment, respectively, the description thereof is omitted.

Opening portions 171A and 173A are provided in the gate insulating layer and the protective insulating layer. The source electrode 201A is electrically connected to the source region S of the oxide semiconductor layer 140A through the opening 171A. Similarly, the drain electrode 203A is electrically connected to the drain region D of the oxide semiconductor layer 140A through the opening 173A. The planar shape of the gate electrode 160A on the oxide semiconductor layer 140A is a U shape. In the plan view, the source electrode 201A is arranged inside the U shape, and the drain electrode 203A is arranged outside the U shape. In the channel region CH, the width of the gate electrode 160A corresponds to the channel length L, and the length along the U shape of the gate electrode 160A corresponds to the channel width W. As shown in FIG. 18, in the semiconductor device 10A, since the channel width W can be made larger than the channel length L, the current can be increased.

Also in the semiconductor device 10A, the ion implantation of the impurity is performed through the gate insulating layer using the gate electrode 160A as a mask to form a hydrogen trap region in the gate insulating layer and the oxide insulating layer. Therefore, since hydrogen can be suppressed from entering the oxide semiconductor layer 140A, variations in the electrical characteristics are small in the semiconductor device 10A. In particular, variations in threshold voltage in the electrical characteristics can be suppressed.

EXAMPLES

The semiconductor device 10 is described in more detail based on the manufactured samples.

1. Difference Due to Presence or Absence of Ion Implantation

1-1. Preparation of Samples of Examples

For samples of Examples 1 and 2, semiconductor devices were manufactured using the manufacturing method described in the First Embodiment. That is, in Examples 1 and 2, the ion implantation of boron was performed through the gate insulating layer 150 in manufacturing the semiconductor device. Although the oxide semiconductor layer of Example 1 had an amorphous structure before the OS annealing, the oxide semiconductor layer was crystallized after the OS annealing and had a polycrystalline structure. The oxide semiconductor layer of Example 2 had an amorphous structure even after the OS annealing.

1-2. Preparation of Samples of Comparative Samples

For samples of Comparative Example 1 and Comparative Example 2, semiconductor devices were manufactured by the manufacturing method described in the First Embodiment without the ion implantation. The oxide semiconductor layer of Comparative Example 2 had an amorphous structure.

1-3. Electrical Characteristics

Figure 19:
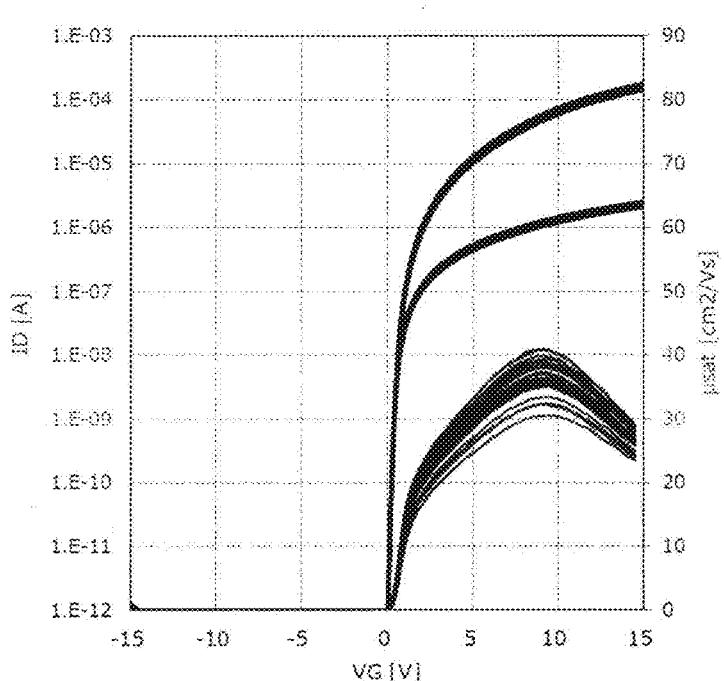
FIG. 19 is a graph showing electrical characteristics of semiconductor devices of Examples 1 and 2.
Figure 19:
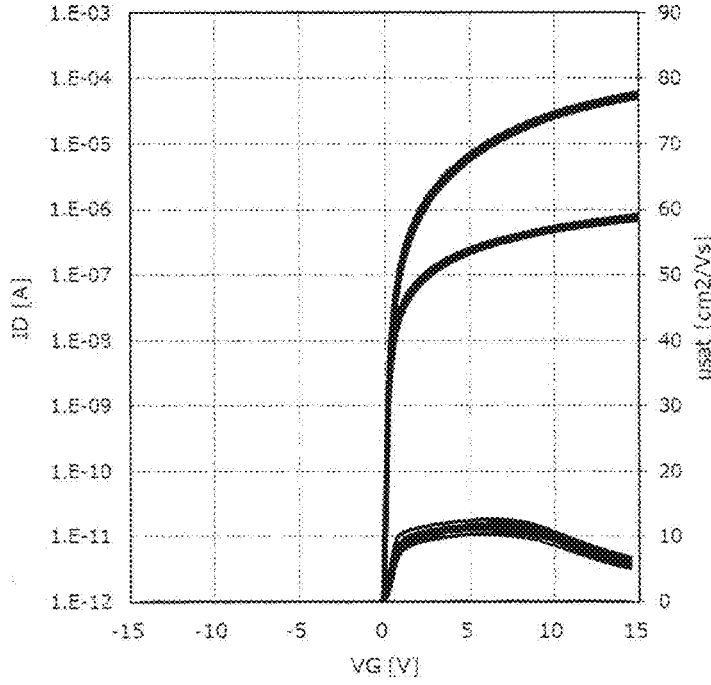
Figure 23:
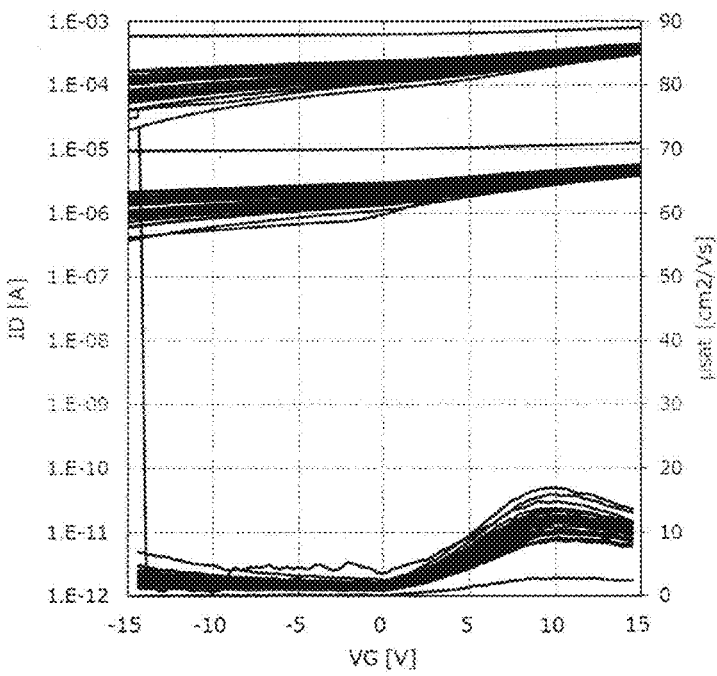
FIG. 23 is a graph showing electrical characteristics of semiconductor devices of Comparative Examples 1 and 2.
Figure 23:
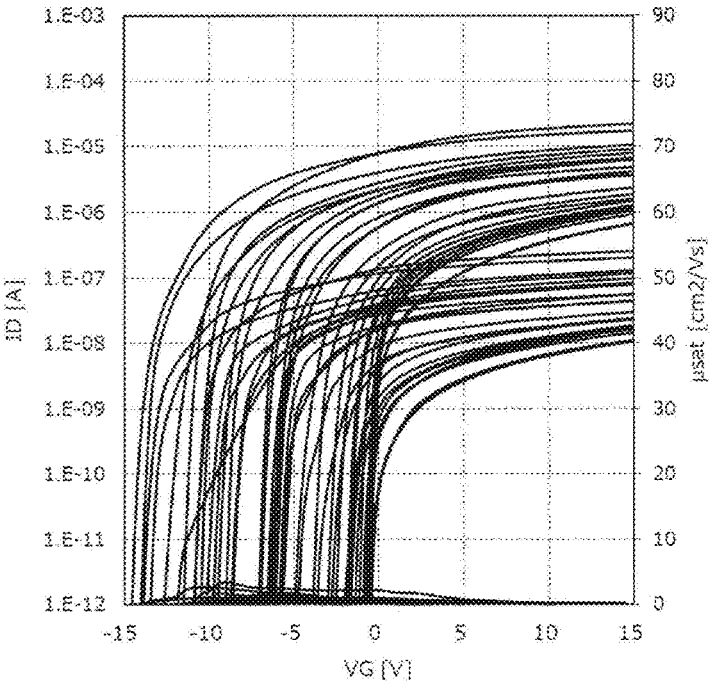

FIG. 19 is a graph showing electrical characteristics of the semiconductor devices of Examples 1 and 2. FIG. 23 is a graph showing electrical characteristics of the semiconductor devices of Comparative Examples 1 and 2. Each of the graphs shown in FIGS. 19 and 23 show the electrical characteristics of 26 samples with channel width W/channel length L=4.5 µm/3.0 µm. In the graph showing the electrical characteristics, the vertical axis indicates the drain current Id, and the horizontal axis indicates the gate voltage Vg. Table 1 shows the measurement conditions for the electrical characteristics of each sample.

TABLE 1

| | |
|---|---|
| Source-Drain Voltage | 0.1 V (dotted line), 10 V (solid line) |
| Gate Voltage | −15 V to +15 V |
| Measurement Environment | room temperature, darkroom |

As shown in FIG. 19, in the samples of Examples 1 and 2, electrical characteristics with small variations in threshold voltage were obtained. On the other hand, as shown in FIG. 23, in the samples of Comparative Example 1, the threshold voltage shifted to the negative side, and electrical characteristics with large variations were obtained. Further, in the sample of Comparative Example 2, the threshold voltage was not able to be confirmed in the range of the gate voltage from −15V to +15V.

According to the results of FIGS. 19 and 23, regardless of whether the oxide semiconductor layer has a polycrystalline structure or an amorphous structure, when the ion implantation is performed through the gate insulating layer, the electrical characteristics that show switching performance with a sharp increase in current at a gate voltage near 0 V are obtained. On the other hand, when the ion implantation is not performed through the gate insulating layer, the electrical characteristics showing switching performance cannot be obtained. This seems to be the reason why the insulating properties of the channel region are reduced due to the increase in the carrier concentration in the channel region of the oxide semiconductor layer. In the samples of Comparative Examples 1 and 2, unlike the samples of Examples 1 and 2, hydrogen trap regions are not formed in the gate insulating layer and the oxide semiconductor layer by the ion implantation. Therefore, it is considered that hydrogen easily enters the channel region of the oxide semiconductor layer through the gate insulating layer and the oxide insulating layer. The entering hydrogen is trapped by the oxygen defects in the channel region to generate carriers, so that the carrier concentration in the channel region is increased.

2. Differences Due to Ion Implantation Conditions

2-1. Manufacturing of Samples of Examples

As samples of Examples 3 to 14, semiconductor devices were manufactured using the manufacturing method described in the First Embodiment. The samples of Examples 3 to 8 have a Structure A. The samples of Examples 9 to 14 have a Structure B. The conditions for Structure A and Structure B are shown in Table 2.

TABLE 2

| | | Structure A | Structure B |
|---|---|---|---|
| nitride insulating layer | SiNx | 300 nm | 200 nm |
| oxide insulating layer | SiOx | 200 nm | 100 nm |
| oxide semiconductor layer | Poly-OS | 30 nm | 15 nm |
| gate insulating layer | SiOx | 100 nm | 125 nm |

Figure 20:
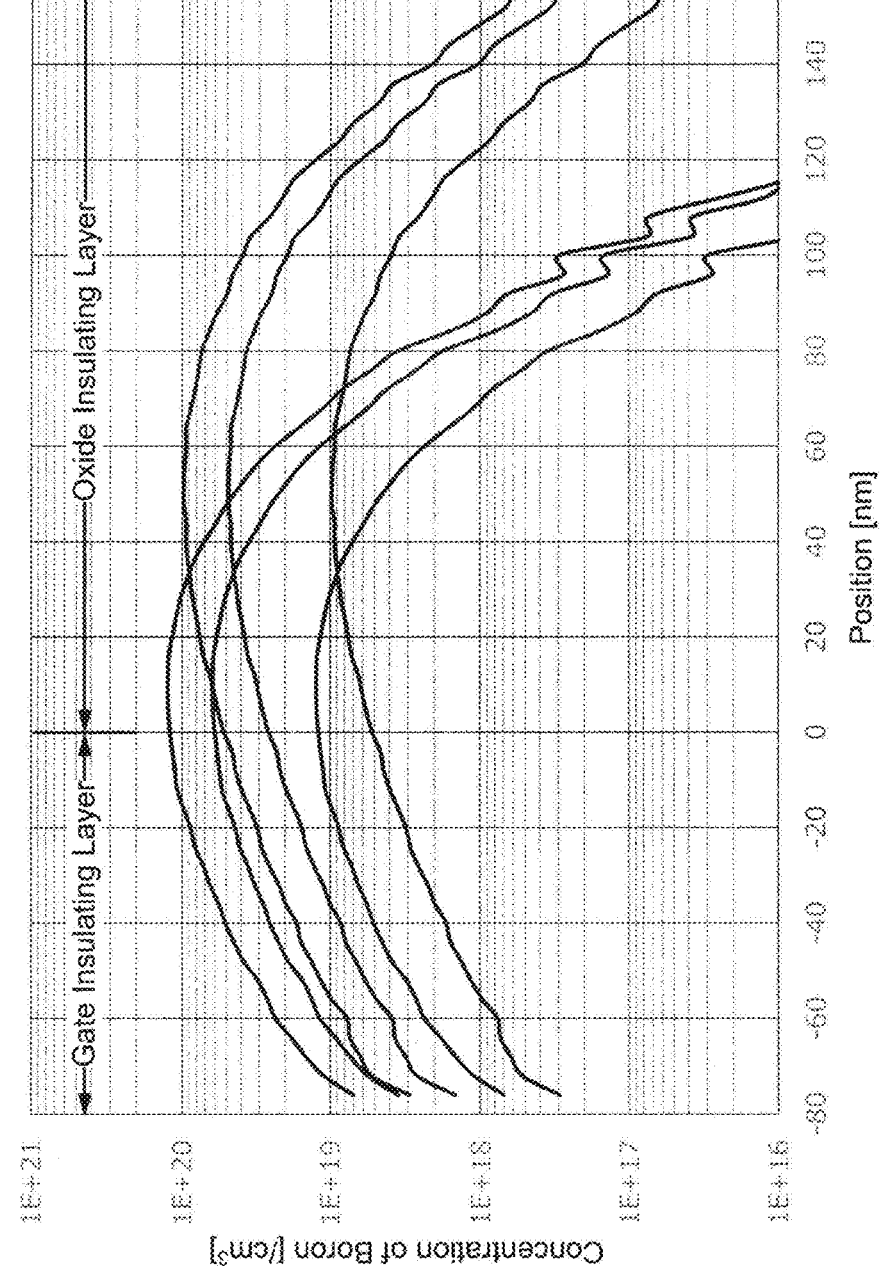
FIG. 20 is a graph showing concentration profiles of boron in ion implantation performed in manufacturing semiconductor devices of Examples 3 to 8.
Figure 21:
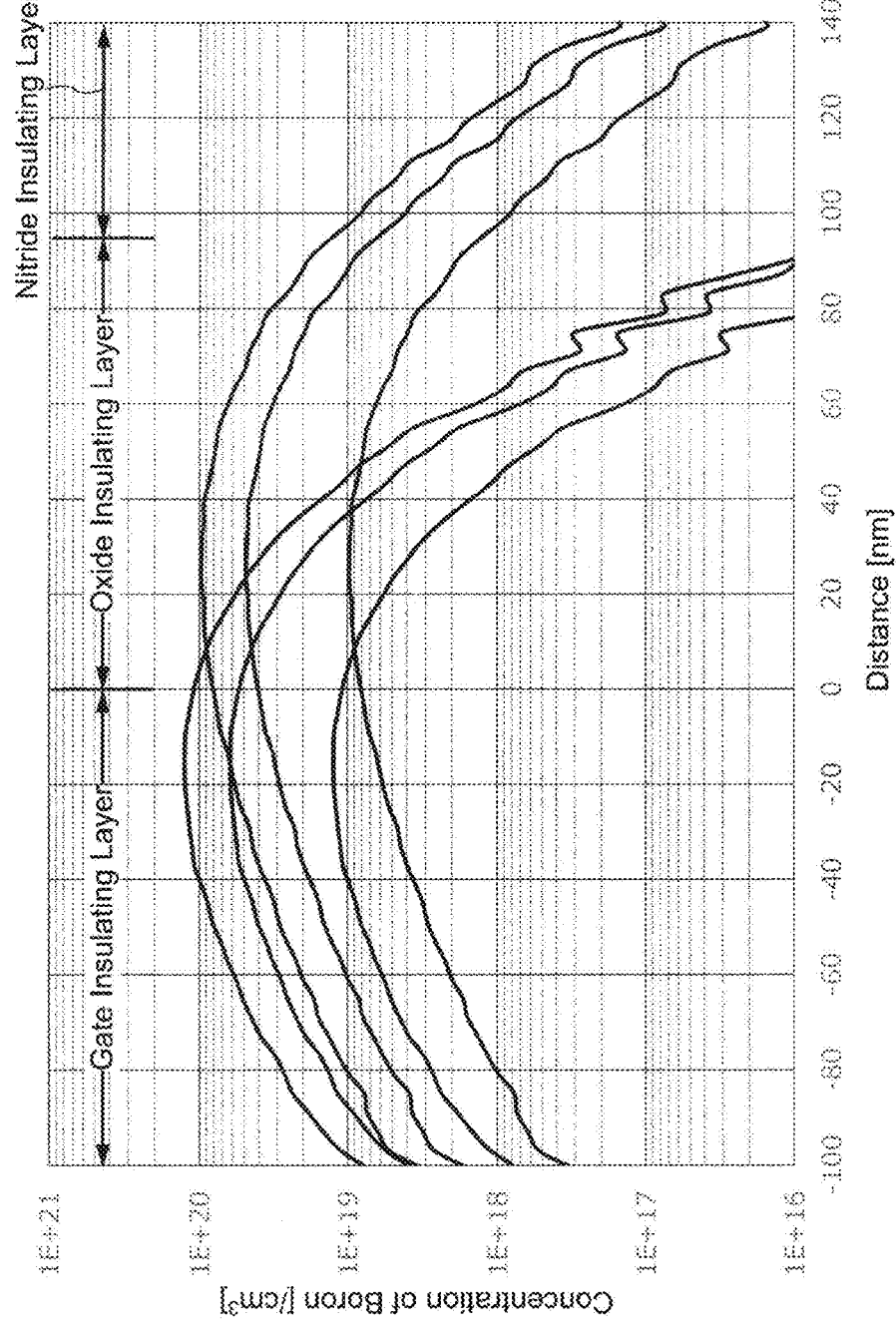
FIG. 21 is a graph showing concentration profiles of boron in ion implantation performed in manufacturing semiconductor devices of Examples 9 to 14.
Figure 22A:
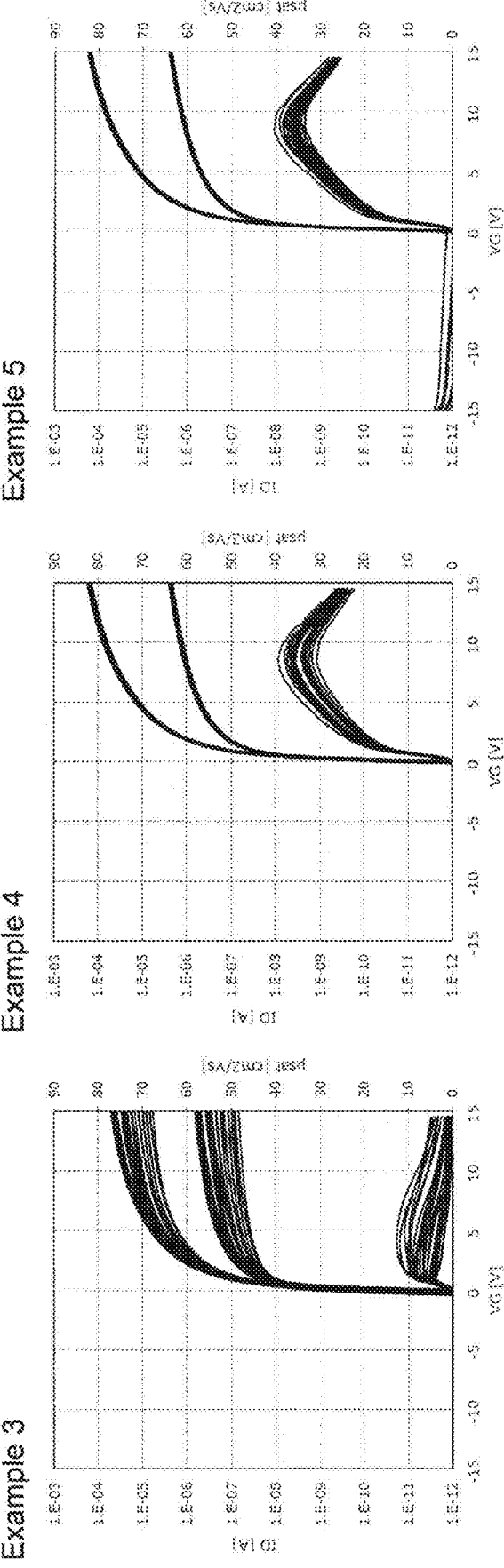
FIG. 22A is a graph showing electrical characteristics of semiconductor devices of Examples 3 to 5.
Figure 22B:
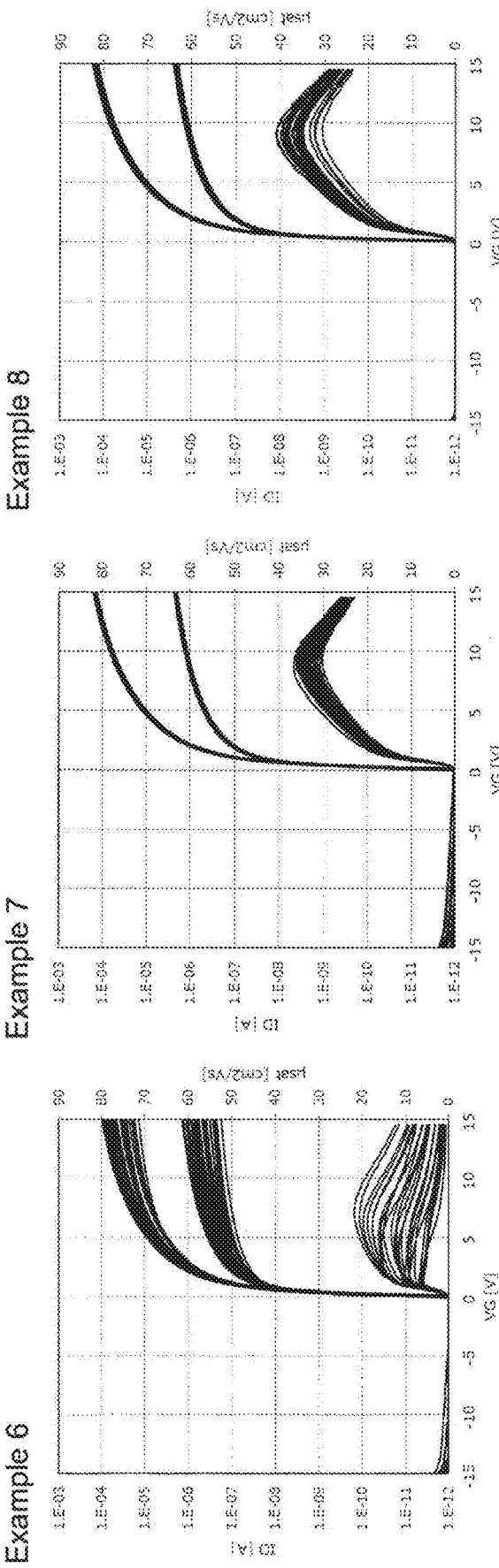
FIG. 22B is a graph showing electrical characteristics of semiconductor devices of Examples 6 to 8.
Figure 22C:
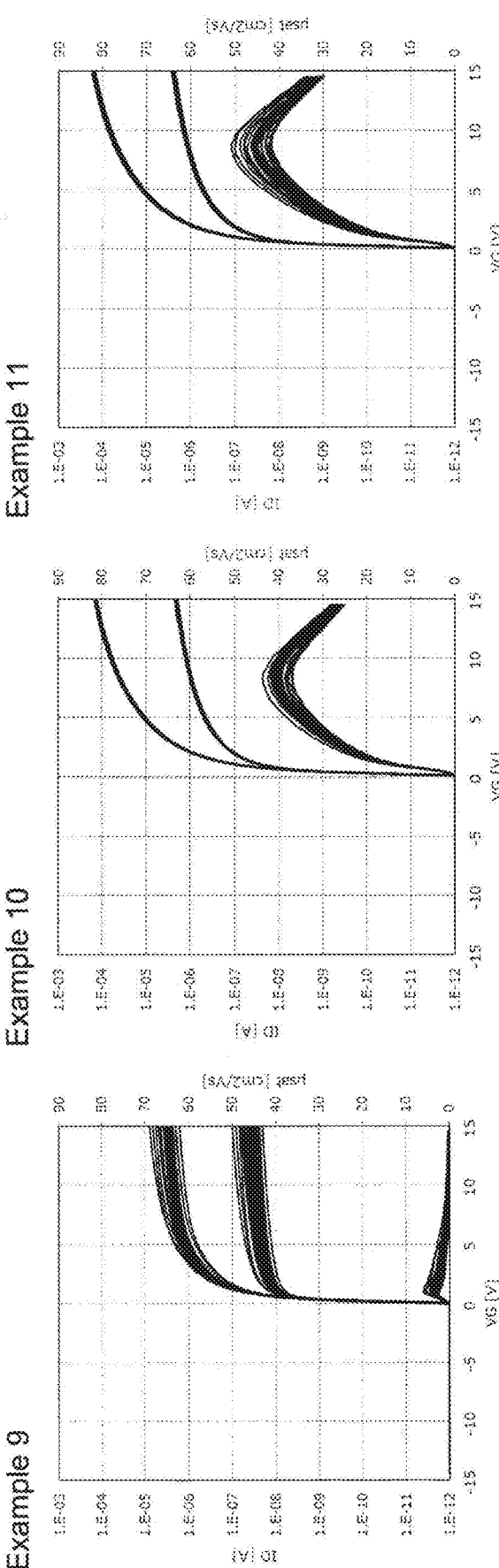
FIG. 22C is a graph showing electrical characteristics of semiconductor devices of Examples 9 to 11.
Figure 22D:
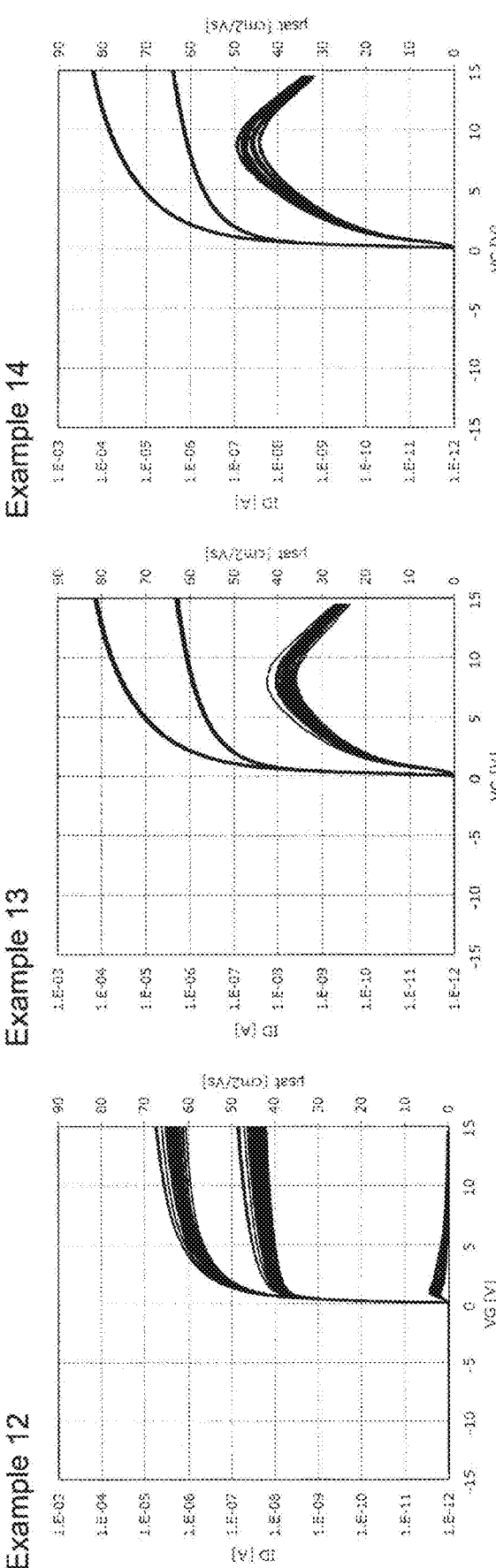
FIG. 22D is a graph showing electrical characteristics of semiconductor devices of Examples 12 to 14.

Table 3 shows the conditions for the ion implantation of boron through the gate insulating layer. FIGS. 20 and 21 show concentration profiles of boron in each sample. FIG. 20 is a graph showing concentration profiles of boron of the ion implantation performed in manufacturing semiconductor devices of Examples 3 to 8. FIG. 21 is a graph showing concentration profiles of boron of the ion implantation performed in manufacturing semiconductor devices of Examples 9 to 14. In addition, in FIGS. 20 and 21, the horizontal axis of the graphs represents the distance from the interface between the gate insulating layer and the oxide insulating layer when the interface corresponds to 0 nm (the oxide insulating layer side is in the positive direction and the gate insulating layer side is in the negative direction), and the vertical axis of the graph represents the concentration of boron.

TABLE 3

| | Dose Amount | Accelerating Voltage |
|---|---|---|
| Example 3, Example 9 | $1 \times 10^{14}/cm^2$ | 20 keV |
| Example 4, Example 10 | $5 \times 10^{14}/cm^2$ | 20 keV |
| Example 5, Example 11 | $1 \times 10^{15}/cm^2$ | 20 keV |
| Example 6, Example 12 | $1 \times 10^{14}/cm^2$ | 29 keV |
| Example 7, Example 13 | $5 \times 10^{14}/cm^2$ | 29 keV |
| Example 8, Example 14 | $1 \times 10^{15}/cm^2$ | 29 keV |

The concentration profiles of the samples of Examples 3 to 5 have peaks in the gate insulating layer. The concentration profiles of the samples of Examples 6 to 14 have peaks in the oxide insulating layer. In the samples of Examples 3 to 14, the concentration of boron in the oxide insulating layer at a position of 16 nm away from the interface between the gate insulating layer and the oxide insulating layer in the thickness direction of the oxide insulating layer was greater than or equal to $1 \times 10^{18}/cm^3$. Further, in the samples of Examples 3 to 14, the concentration of boron in the oxide insulating layer at a position of 40 nm away from the interface between the gate insulating layer and the oxide insulating layer in the thickness direction of the oxide insulating layer was greater than or equal to $1 \times 10^{17}/cm^3$. Therefore, in the samples of Examples 3 to 14, the concentration of boron in the region from the interface between the gate insulating layer and the oxide insulating layer to the position 40 nm away in the film thickness direction of the oxide insulating layer was greater than or equal to $1 \times 10^{16}/cm^3$.

The concentration of boron in the oxide insulating layer is described in more detail. In the samples of Examples 3 to 14, the concentration of boron in the oxide insulating layer at a position of 16 nm away from the interface between the gate insulating layer and the oxide insulating layer in the thickness direction of the oxide insulating layer is greater than or equal to $5 \times 10^{18}/cm^3$. In particular, in the samples of Examples 4, 5, 7, 8, 10, 11, 13, and 14, the concentration of boron in the oxide insulating layer at a position of 16 nm away from the interface between the gate insulating layer and the oxide insulating layer in the thickness direction of the oxide insulating layer is greater than or equal to $2 \times 10^{19}/$ cm$^3$. Further, in the samples of Examples 3 to 14, the concentration of boron in the oxide insulating layer at a position of 40 nm away from the interface between the gate insulating layer and the oxide insulating layer in the thickness direction of the oxide insulating layer is greater than or equal to $1 \times 10^{18}/cm^3$. In particular, in the samples of Examples 4, 5, 7, 8, 13, and 14, the concentration of boron in the oxide insulating layer at a position of 40 nm away from the interface between the gate insulating layer and the oxide insulating layer in the thickness direction of the oxide insulating layer is greater than or equal to $2 \times 10^{19}/cm^3$. Furthermore, in the samples of Examples 3 to 8 and 12 to 14, the concentration of boron the oxide insulating layer at a position of 100 nm away from the interface between the gate insulating layer and the oxide insulating layer in the thickness direction of the oxide insulating layer is greater than or equal to $1 \times 10^{16}/cm^3$. In particular, in Examples 6 to 8, the concentration of boron in the region from the interface between the gate insulating layer and the oxide insulating layer to the position of 150 nm away in the thickness direction of the oxide insulating layer is greater than or equal to $1 \times 10^{16}/cm^3$.

2-2. Manufacturing of Samples of Comparative Examples

Figure 24:
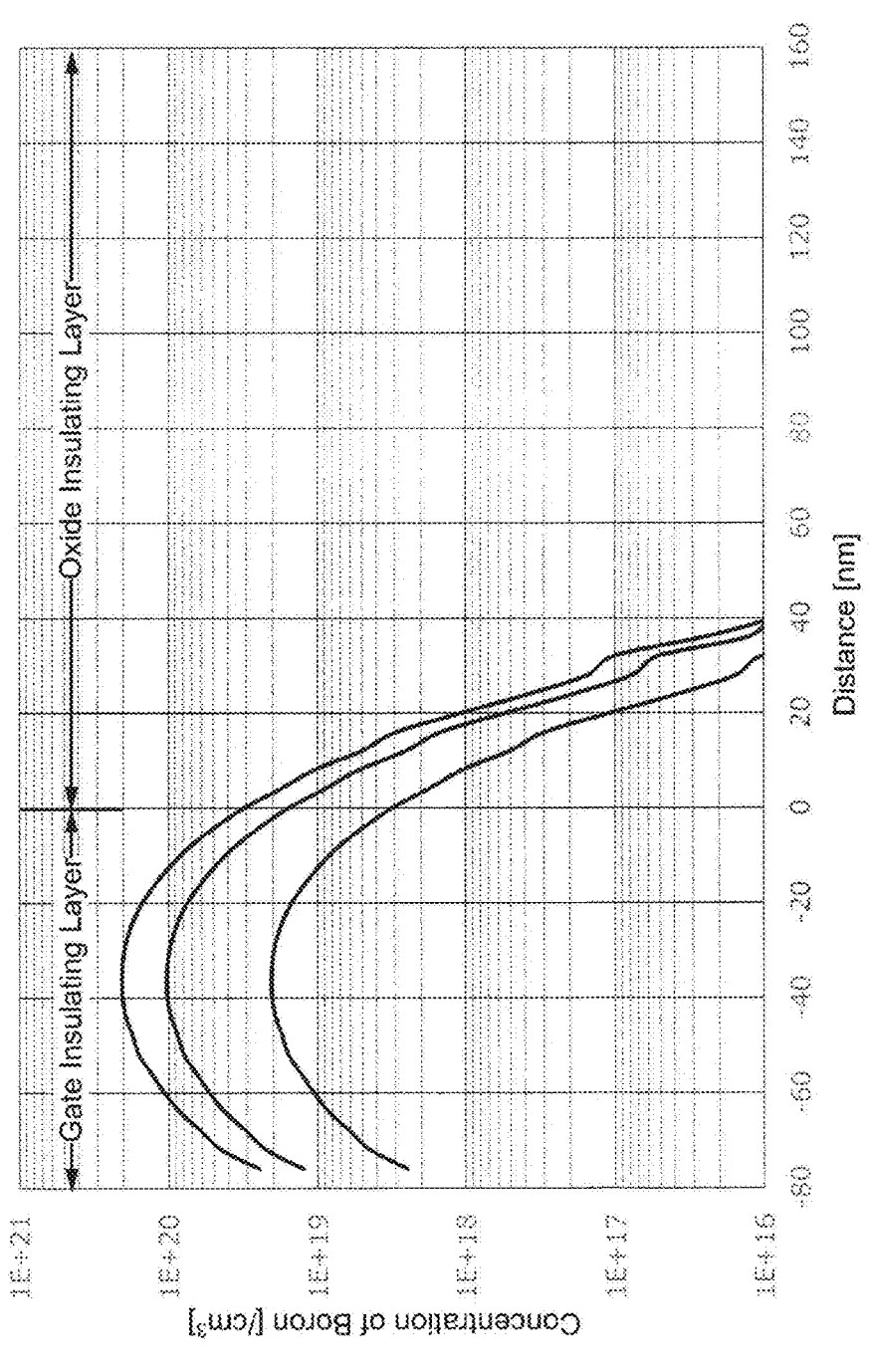
FIG. 24 is a graph showing concentration profiles of boron in ion implantation performed in manufacturing semiconductor devices of Comparative Examples 3 to 5.
Figure 25:
FIG. 25 is a graph showing concentration profiles of boron in ion implantation performed in manufacturing semiconductor devices of Comparative Examples 6 to 8.

As samples of Comparative Examples 3 to 8, semiconductor devices were manufactured under ion implantation conditions different from those of Examples 3 to 14. The structures and the ion implantation conditions of the samples of Comparative Examples 3 to 8 are shown in Table 4. Further, FIGS. 24 and 25 show concentration profiles of boron in each sample. FIG. 24 is a graph showing a concentration profile of boron in the ion implantation performed in manufacturing the semiconductor devices of Comparative Examples 3 to 5. FIG. 25 is a graph showing a concentration profile of boron in the ion implantation performed in manufacturing the semiconductor devices of Comparative Examples 6 to 8. In addition, in FIGS. 24 and 25, the horizontal axis of the graphs represents the distance from the interface between the gate insulating layer and the oxide insulating layer when the interface corresponds to 0 nm (the oxide insulating layer side is in the positive direction and the gate insulating layer side is in the negative direction), and the vertical axis of the graph represents the concentration of boron.

TABLE 4

| | Structure | Dose Amount | Accelerating Voltage |
|---|---|---|---|
| Comparative Example 3 | Structure A | $1 \times 10^{14}/cm^2$ | 10 keV |
| Comparative Example 4 | Structure A | $5 \times 10^{14}/cm^2$ | 10 keV |
| Comparative Example 5 | Structure A | $1 \times 10^{15}/cm^2$ | 10 keV |
| Comparative Example 6 | Structure B | $1 \times 10^{14}/cm^2$ | 10 keV |
| Comparative Example 7 | Structure B | $5 \times 10^{14}/cm^2$ | 10 keV |
| Comparative Example 8 | Structure B | $1 \times 10^{15}/cm^2$ | 10 keV |

The concentration profiles of the samples of Comparative Examples 3 to 8 have peaks in the gate insulating layer. In the samples of Comparative Examples 3 to 5, the concentration of boron in the oxide insulating layer at a position of 16 nm away from the interface between the gate insulating layer and the oxide insulating layer in the thickness direction of the oxide insulating layer is greater than or equal to $1\times10^{17}/cm^3$ and less than $5\times10^{18}/cm^3$. In the samples of Comparative Examples 6 to 8, the concentration of boron in the oxide insulating layer at a position of 16 nm away from the interface between the gate insulating layer and the oxide insulating layer in the thickness direction of the oxide insulating layer is less than $1\times10^{16}/cm^3$. Further, in the samples of Comparative Examples 3 to 8, the concentration of boron in the oxide insulating layer at a position of 40 nm away from the interface between the gate insulating layer and the oxide insulating layer in the thickness direction of the oxide insulating layer is less than $1\times10^{16}/cm^3$. Therefore, in the samples of Comparative Examples 3 to 8, the concentration of boron in the region from the interface between the gate insulating layer and the oxide insulating layer to the position of 40 nm away in the film thickness direction of the oxide insulating layer is not greater than or equal to $1\times10^{16}/cm^3$.

2-3. Electrical Characteristics

Figure 26A:
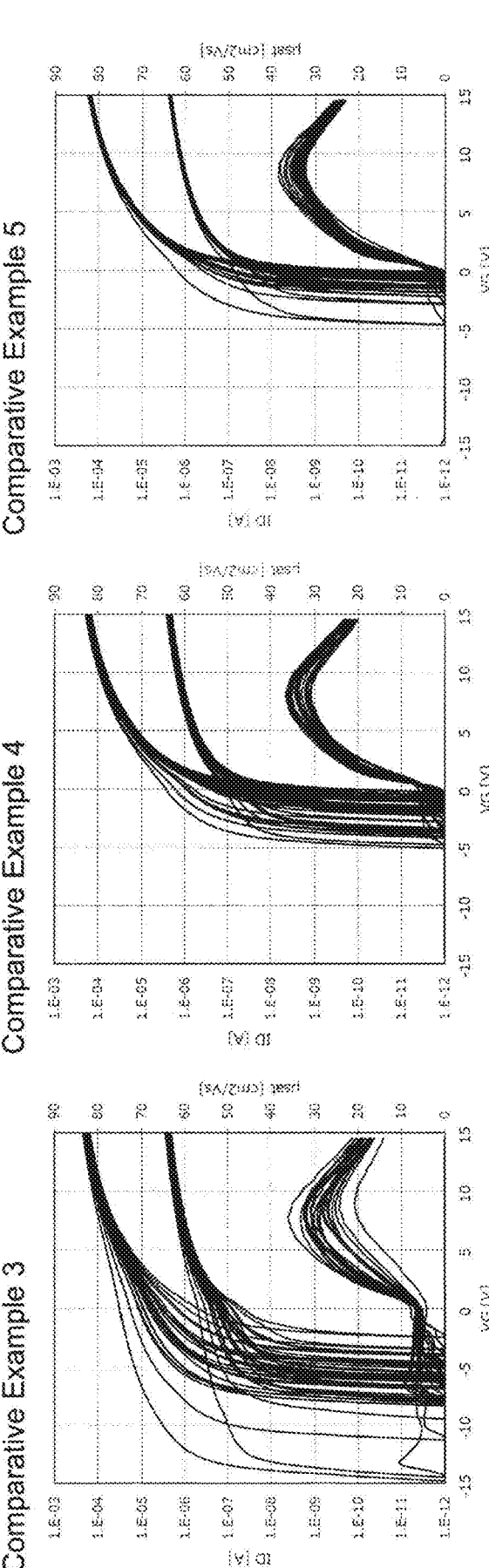
FIG. 26A is a graph showing electrical characteristics of semiconductor devices of Comparative Examples 3 to 5.
Figure 26B:
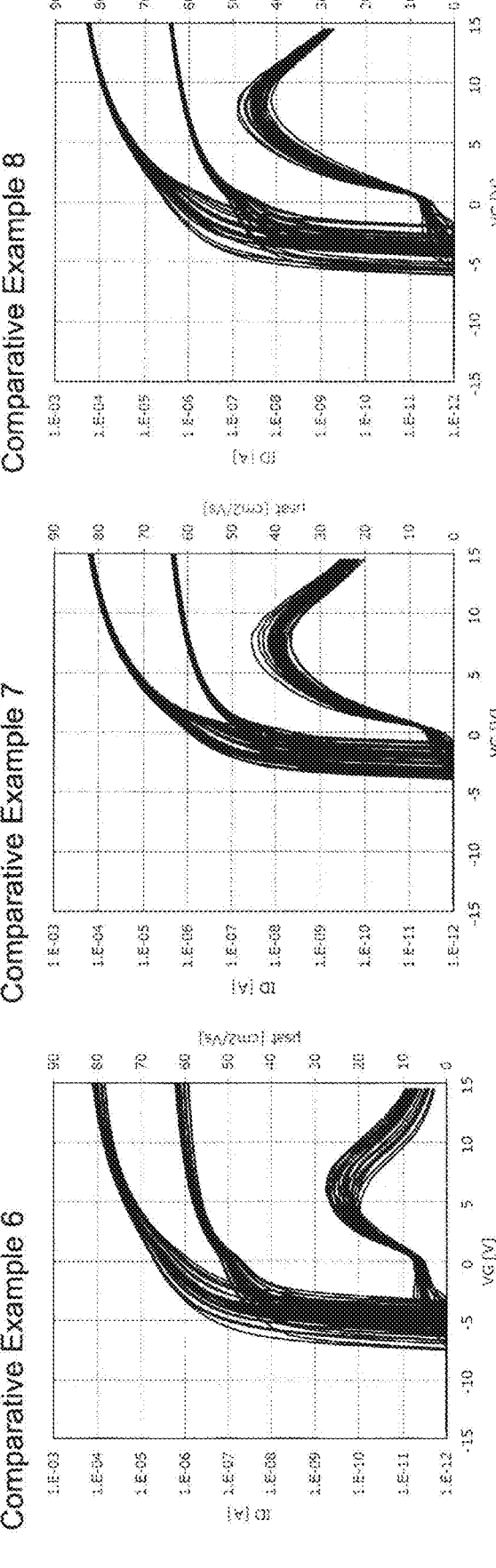
FIG. 26B is a graph showing electrical characteristics of semiconductor devices of Comparative Examples 6 to 8.

FIGS. 22A to 22D are graphs showing electrical characteristics of the semiconductor devices of Examples 3 to 14. FIGS. 26A and 26B are graphs showing electrical characteristics of the semiconductor devices of Comparative Examples 3 to 8. Each of the graphs shown in FIGS. 22A to 22D, 26A, and 26B show the electrical characteristics of 26 samples with channel width W/channel length L=4.5 μm/3.0 μm. The conditions for measuring the electrical characteristics of each sample are the same as those shown in Table 1.

As shown in FIGS. 22A to 22D, in the samples of Examples 3 to 14, transistor characteristics with small variations in threshold voltage were obtained. On the other hand, as shown in FIGS. 26A and 26B, in the samples of Comparative Examples 3 to 8, the threshold voltage shifted to the negative side, and electrical characteristics with large variations were obtained.

According to the results of FIGS. 22A to 22D, 26A, and 26B, when the ion implantation is performed through the gate insulating layer, boron is implanted not only in the gate insulating layer but also to a certain depth in the oxide insulating layer. This can suppress variations in the threshold voltage of the semiconductor device. In the samples of Examples 3 to 14, the hydrogen trap regions are formed deeper in the oxide insulating layer than the samples of Comparative Examples 3 to 8. Therefore, it is considered that hydrogen entering the channel region of the oxide semiconductor layer through the oxide insulating layer is suppressed.

Each of the embodiments described above as an embodiment of the present invention can be appropriately combined and implemented as long as no contradiction is caused. Further, the addition, deletion, or design change of components, or the addition, deletion, or condition change of processes as appropriate by those skilled in the art based on each of embodiments are included in the scope of the present invention as long as they are provided with the gist of the present invention.

It is understood that, even if the effect is different from those provided by each of the above-described embodiments, the effect obvious from the description in the specification or easily predicted by persons ordinarily skilled in the art is apparently derived from the present invention.

What is claimed is:

1. A semiconductor device comprising:
an oxide insulating layer;
an oxide semiconductor layer on the oxide insulating layer;
a gate insulating layer on the oxide insulating layer and the oxide semiconductor layer, the gate insulating layer covering the oxide semiconductor layer;
a gate electrode on the gate insulating layer; and
a protective insulating layer on the gate insulating layer and the gate electrode,
wherein the gate insulating layer comprises:
    a first region overlapping the gate electrode, and
    a second region not overlapping the gate electrode and in contact with the protective insulating layer,
the oxide insulating layer comprises:
    a third region overlapping the gate electrode, and
    a fourth region not overlapping the gate electrode and the oxide semiconductor layer and in contact with the gate insulating layer,
the oxide semiconductor layer comprises:
    a channel region, and
    a source region and a drain region having a greater carrier concentration than the channel region,
each of the source region, the drain region, the second region, and the fourth region contains an impurity,
a hydrogen concentration of the second region is greater than a hydrogen concentration of the first region,
a hydrogen concentration of the fourth region is greater than a hydrogen concentration of the third region, and
in the fourth region, a concentration of the impurity in a region from an interface with the gate insulating layer to a position of 150 nm away in a thickness direction of the oxide insulating layer is greater than or equal to $1\times10^{16}/cm^3$.

2. The semiconductor device according to claim 1, wherein in the fourth region, a concentration of the impurity at a position of 16 nm away from an interface with the gate insulating layer in a thickness direction of the oxide insulating layer is greater than or equal to $1\times10^{18}/cm^3$.

3. The semiconductor device according to claim 1, wherein in the fourth region, a concentration of the impurity at a position of 16 nm away from an interface with the gate insulating layer in a thickness direction of the oxide insulating layer is greater than or equal to $5\times10^{18}/cm^3$.

4. The semiconductor device according to claim 1, wherein in the fourth region, a concentration of the impurity at a position of 40 nm away from an interface with the gate insulating layer in a thickness direction of the oxide insulating layer is greater than or equal to $1\times10^{16}/cm^3$.

5. The semiconductor device according to claim 1, wherein in the fourth region, a concentration of the impurity at a position of 40 nm away from an interface with the gate insulating layer in a thickness direction of the oxide insulating layer is greater than or equal to $1\times10^{17}/cm^3$.

6. The semiconductor device according to claim 1, wherein in the fourth region, a concentration of the impurity at a position of 40 nm away from an interface with the gate insulating layer in a thickness direction of the oxide insulating layer is greater than or equal to $1\times10^{18}/cm^3$.

7. The semiconductor device according to claim 1, wherein in the fourth region, a concentration of the impurity in a region from an interface with the gate insulating layer to a position of 40 nm away from the interface in a thickness direction of the oxide insulating layer is greater than or equal to $1\times10^{16}/cm^3$.

8. The semiconductor device according to claim 1, wherein in the fourth region, a concentration of the impurity in a region from an interface with the gate insulating layer to a position of 100 nm away from the interface in a thickness direction of the oxide insulating layer is greater than or equal to $1\times10^{16}/cm^3$.

9. The semiconductor device according to claim 1, wherein the impurity is one selected from the group consisting of boron, phosphorus, argon, and nitrogen.

* * * * *